(12) United States Patent  
Hashimoto et al.

(10) Patent No.: US 7,376,019 B2
(45) Date of Patent: May 20, 2008

(54) NONVOLATILE SEMICONDUCTOR MEMORY

(75) Inventors: Kiyokazu Hashimoto, Kanagawa (JP); Hiroshi Sugawara, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 156 days.

(21) Appl. No.: 11/378,248

(22) Filed: Mar. 20, 2006

(65) Prior Publication Data

US 2006/0221699 A1 Oct. 5, 2006

(30) Foreign Application Priority Data

Mar. 31, 2005 (JP) ............................... 2005-101806

(51) Int. Cl.
*G11C 16/04* (2006.01)

(52) U.S. Cl. .............................. 365/185.28; 365/185.11; 365/185.18; 365/185.23

(58) Field of Classification Search ........... 365/185.11, 365/185.18, 185.23, 185.28
See application file for complete search history.

(56) References Cited

U.S. PATENT DOCUMENTS

| | | | | |
|---|---|---|---|---|
| 5,329,488 A | * | 7/1994 | Hashimoto | ............. 365/185.09 |
| 5,774,398 A | * | 6/1998 | Ishida | .................... 365/185.11 |
| 6,172,922 B1 | * | 1/2001 | Suzuki | ....................... 365/203 |
| 6,363,027 B1 | * | 3/2002 | Komatsu | ............... 365/230.03 |
| 6,762,959 B2 | * | 7/2004 | Kim | ....................... 365/189.09 |

FOREIGN PATENT DOCUMENTS

JP 4-74391 3/1992

* cited by examiner

*Primary Examiner*—Hoai V. Ho
(74) *Attorney, Agent, or Firm*—McGinn IP Law Group, PLLC

(57) ABSTRACT

The nonvolatile semiconductor memory includes a plurality of memory devices for storing data, a write circuit for supplying a high voltage for data writing, a plurality of selectors connected between the write circuit and the plurality of memory devices, for selecting one from the plurality of memory devices; and a control circuit for selecting one from the plurality of selectors, inputting a control voltage to a control terminal of the selected selector, and setting a write voltage for the memory device according to the control voltage.

11 Claims, 15 Drawing Sheets

NONVOLATILE SEMICONDUCTOR MEMORY

BACKGROUND OF THE INVENTION

1. Field of the Invention

The present invention relates to nonvolatile semiconductor memory and, particularly, to nonvolatile semiconductor memory having a selector for selecting a memory device and controlling a write current.

2. Description of Related Art

Flash memory, which is one of nonvolatile semiconductor memory, has been widely used recently. Recent electrically data rewritable memory such as flash memory has a large capacity, and a smaller semiconductor device of a memory cell has been developed accordingly. In spite of the recent increase in memory capacity, the number of input/output terminals of a memory product remains the same as before. Therefore, large capacity memory generally has a hierarchical selector for selecting a memory device, thereby achieving efficient use of a memory area with a small number of input/output terminals. A sector, which is a data rewriting unit, includes a plurality of memory devices. Each memory device stores data as a charge injected to the memory device.

An example of conventional memory is described in Japanese Unexamined Patent Application Publication No. H04-74391. FIG. 13 shows a pattern diagram of a plane layout of the memory. The memory includes Y10 selector $1310_0$ to Y1m selector $1310_m$ (which are referred to herein collectively as the Y1 selector 1310) to serve as high order selectors, and Y10DEC $1311_0$ to Y1mDEC $1311_m$ (which are referred to herein collectively as the Y1DEC 1311) for controlling the Y1 selector 1310. Each of the Y1 selector 1310 has n number of cells. The cells have the same structure. For example, the n-th cell $1305_n$ has a Y2n selector $1312_n$ to serve as a low order selector, a decoder Y2nDEC $1313_n$ for controlling the Y2n selector $1312_n$, a sector $1314_n$ and a decoder XnDEC $1315_n$ for controlling memory devices in the sector. The capacity of the memory depends on the number of the selectors Y1 selector 1310, the decoders Y1DEC 1311 and the cells.

The memory also includes a PAD 1301 for making connection with an external device, an input/output circuit 1302 having an input/output buffer, an input/output controller 1303 for controlling a signal between the input/output circuit 1302 and an internal device, and an internal booster 1304 for generating a boosted voltage used internally. The memory further includes a group of write circuits 1306, which includes WC0 to WC15, for supplying a write voltage to a memory device and a group of sense amplifiers 1307, which includes SA0 to SA15, for reading stored data. Each cell is connected to the write circuit group 1306 and the sense amplifier group 1307 through wiring 1308.

When reading stored data, the sense amplifiers 1307 read the data stored in the memory device. The data is then supplied to the outside through the input/output controller 1303, the input/output circuit 1302, and the PAD 1301.

When writing data into a memory device of 0n, the group of write circuits 1306 supplies a write voltage and write control current to the memory device to which data is to be written according to an input signal input from the outside through the PAD 1301, the input/output circuit 1302 and the input/output controller 1303. Further, the decoder Y10DEC $1311_0$ selects a predetermined Y10 selector $1310_0$ and the decoder Y2nDEC $1313_n$ selects a predetermined selector in the Y2n selector $1312_n$ according to the input signal. Also according to the input signal, the decoder XnDEC $1315_n$ selects a predetermined memory device in the Cn sector $1314_n$. The write voltage and the write control current from the write circuit group 1306 are supplied to the selected memory device in the Cn sector $1314_n$ through the selected Y10 selector $1310_0$ and Y2n selector $1312_n$. The memory device accumulates electrons in a storage node of a cell transistor according to the write voltage and the write control current supplied by the above operation, thereby storing data.

FIG. 14 is a circuit diagram of a data memory circuit when storing data into a memory device. The data memory circuit shown in FIG. 14 includes a write circuit WC0, a transistor QY1 which is a selected Y10 selector, a transistor QY2 which is a selected Y2n selector, and a selected memory device QX. The write circuit WC0 has a write gate QW1 and a control transistor QK. The gate terminal of the write gate QW1 is supplied with a voltage VR and the source terminal is supplied with a write control voltage VPDD, and the drain terminal is connected to the drain terminal of the control transistor QK. The gate terminal of the control transistor QK is supplied with a controlled voltage VPGD. The voltage VPGD determines a write control current IL of the control transistor QK. The source terminal of the control transistor QK serves as an output of the write circuit WC0.

The output of the write circuit WC0 and the drain terminal of the transistor QY1 in the next stage are connected by a long wiring length for the sake of layout, and therefore wiring resistance R exist therebetween. Thus, a wiring resistor R is placed in the circuit diagram shown in FIG. 14.

The gate terminal of the transistor QY1 is supplied with a voltage VPPG from Y10DEC $1011_0$. The drain terminal of the transistor QY1 serves as an input terminal of a cell. The source terminal of the transistor QY1 is connected to the drain terminal of the transistor QY2 in the next stage.

The gate terminal of the transistor QY2 is supplied with a voltage VPPG from Y2nDEC $1313_0$. The source terminal of the transistor QY2 is connected to the drain terminal of a memory device QX in the next stage. A voltage between the source terminal of the transistor QY2 and the memory device QX serves as a write voltage VD.

The gate terminal of the memory device QX is supplied with a voltage VPPG from XnDEC $1315_n$, and the source terminal is supplied with a voltage CS to be a predetermined voltage in each mode of writing, erasing and reading. When writing data, the memory device QX is supplied with a write control current IL from the write circuit WC0 according to the write voltage VD. The current IL causes electrons to be accumulated in a memory node of the memory device QX, thereby storing data.

FIG. 15 shows a relationship between the current IL and the voltage VD. For example, in the layout shown in FIG. 13, when writing data from the write circuit WC15 into a cell mn, the relationship between the write control current IL and the write voltage VD is as indicated by a write current curve a shown by full line in FIG. 15. The voltage at an origin A of the current curve is a value that is a result of subtracting a threshold voltage VT of the control transistor QK and a product of the wiring resistance R and the current IL from the control voltage VPGD. Since a distance between the write circuit WC15 and the cell mn is short, the wiring resistance R is very small. Thus, the voltage at the origin A may be substantially represented by VPGD-VT. When writing data from the write circuit WC15 into a cell 0n, the relationship between the write control current IL and the write voltage VD is as indicated by a write current curve b shown by dotted line in FIG. 15. Since a distance between the write circuit WC15 and the cell 0n is long, the wiring resistance R is large and the slope of the current curve b is smaller than that of the current curve a. An origin B of the write voltage VD is represented by VPGD-VT-R*IL. Thus, the voltage at the origin of the current curve decrease as the distance from the write circuit to the cell increases. For example, if a write circuit and a cell mn are wired with an aluminum line having a resistance of 0.07Ω/□ per unit area at a width of 5 μm and a length of 100 μm, the wiring resistance R is approximately (100 μm/5 μm)*0.07Ω/□=1.4Ω. On the other hand, a write circuit and a cell On are wired at a width of 5 μm and a length of 10,000 μm, the wiring resistance R is approximately (10,000 μm/5 μm)*0.07Ω/□=1.40Ω.

In FIG. 15, the graph shown by dash-dotted line indicates current-voltage characteristics of a memory device QX. When storing data into the memory device QX, the voltage at an intersection in the graph of the write current characteristics and the current-voltage characteristics of the memory device QX needs to be higher than a write lower limit voltage. A write speed is higher if a voltage at the intersection is a higher.

Since a write circuit sets a write voltage for a memory device in conventional memory, an actual write voltage supplied to the memory device has a level that subtracts a voltage drop due to wiring resistance from a level set by the write circuit. The wiring resistance varies depending on a length from a write circuit to a memory device or a location of a memory device on a chip. Thus, the write voltage varies depending on the layout on a chip, and therefore a write speed varies accordingly. If manufacturing variations of devices, such as variations in threshold voltage and shape, occurs write defect, the voltage at the intersection in the graph of the write current characteristics and the current-voltage characteristics of the memory device falls lower than the write lower limit voltage, which can cause write defect.

SUMMARY OF THE INVENTION

According to an aspect of the present invention, there is provided nonvolatile semiconductor memory which includes a plurality of memory devices for storing data, a write circuit for supplying a high voltage for data writing, a plurality of selectors connected between the write circuit and the plurality of memory devices, for selecting one from the plurality of memory devices; and a control circuit for selecting one from the plurality of selectors, inputting a control voltage to a control terminal of the selected selector, and setting a write voltage for the memory device according to the control voltage.

The present invention controls the gate voltage of the selector by using a voltage output from the control circuit for selecting one from the plurality of selectors. This allows the selector to control a write control current into a memory device. This also allows the selector to determine a write voltage into the memory device. It is thereby possible to eliminate the effect of a voltage drop which occurs due to wiring resistance between the write circuit and the selector since the write voltage is determined according to a control voltage of the selector. This enables to suppress variations in the write voltage to the memory device due to the layout of a chip. As a result, it is able to control the write voltage with high accuracy, thereby suppressing variations in data write speed into a memory device.

BRIEF DESCRIPTION OF THE DRAWINGS

The above and other objects, advantages and features of the present invention will be more apparent from the following description taken in conjunction with the accompanying drawings, in which.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

First Embodiment

Figure 1:
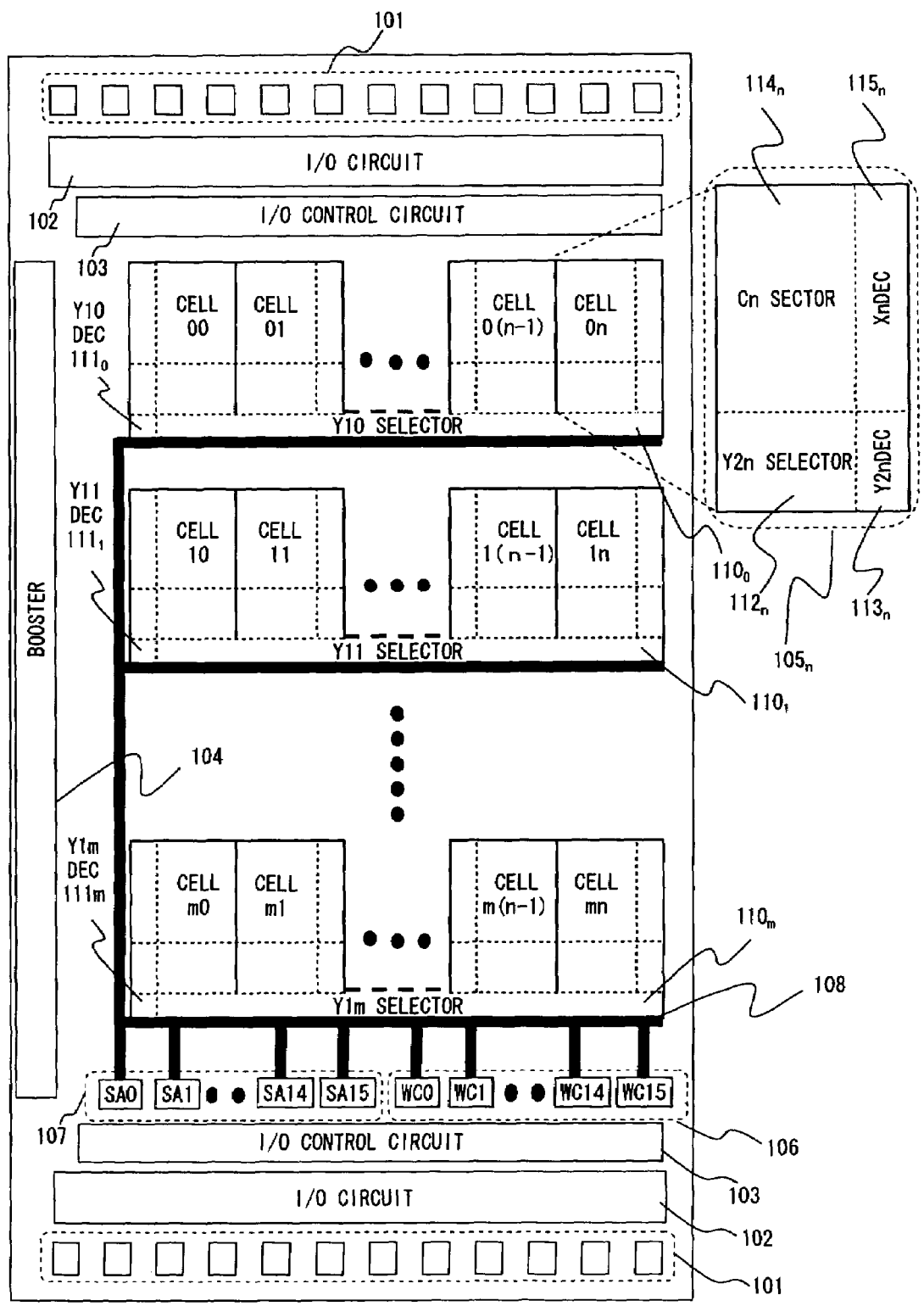
FIG. 1 is a pattern diagram of a plane layout of memory according to a first embodiment.

FIG. 1 shows a pattern diagram of a plane layout of memory according to a first embodiment of the present invention. The memory includes Y10 selector $110_o$ to Y1$m$ selector $110_m$ (which are referred to herein collectively as the Y1 selector 110) to serve as high order selectors, and Y10DEC $111_0$ to Y1$m$DEC $111_m$ (which are referred to herein collectively as the Y1DEC 111) for controlling the Y1 selector 110 with a signal decoded from an address signal. Each of the Y1 selector 110 has a plurality of cells. The cells have the same structure. For example, the n-th cell $105_n$ has a Y2$n$ selector $112_n$ to serve as a low order selector, a decoder Y2$n$DEC $113_n$ for controlling the Y2$n$ selector $112_n$ with a signal decoded from an address signal, a sector $114_n$ including a plurality of memory devices, and a decoder XnDEC $115_n$ for controlling the memory devices. The capacity of the memory depends on the number of the selectors Y1 selector 110, the decoders Y1DEC 111 and the cells.

The memory also includes a PAD 101 for making an external connection, an input/output circuit 102 having an input/output buffer, an input/output controller 103 for controlling a signal between the input/output circuit 102 and an internal device, and an internal booster 104 for generating a boosted voltage used internally. The memory further includes a group of write circuits 106, which includes WC0 to WC15, for supplying a write voltage to a memory device and a group of sense amplifiers 107, which includes SA0 to SA15, for reading stored data. Each cell is connected to the write circuit group 106 and the sense amplifier group 107 through wiring 108.

Figure 2:
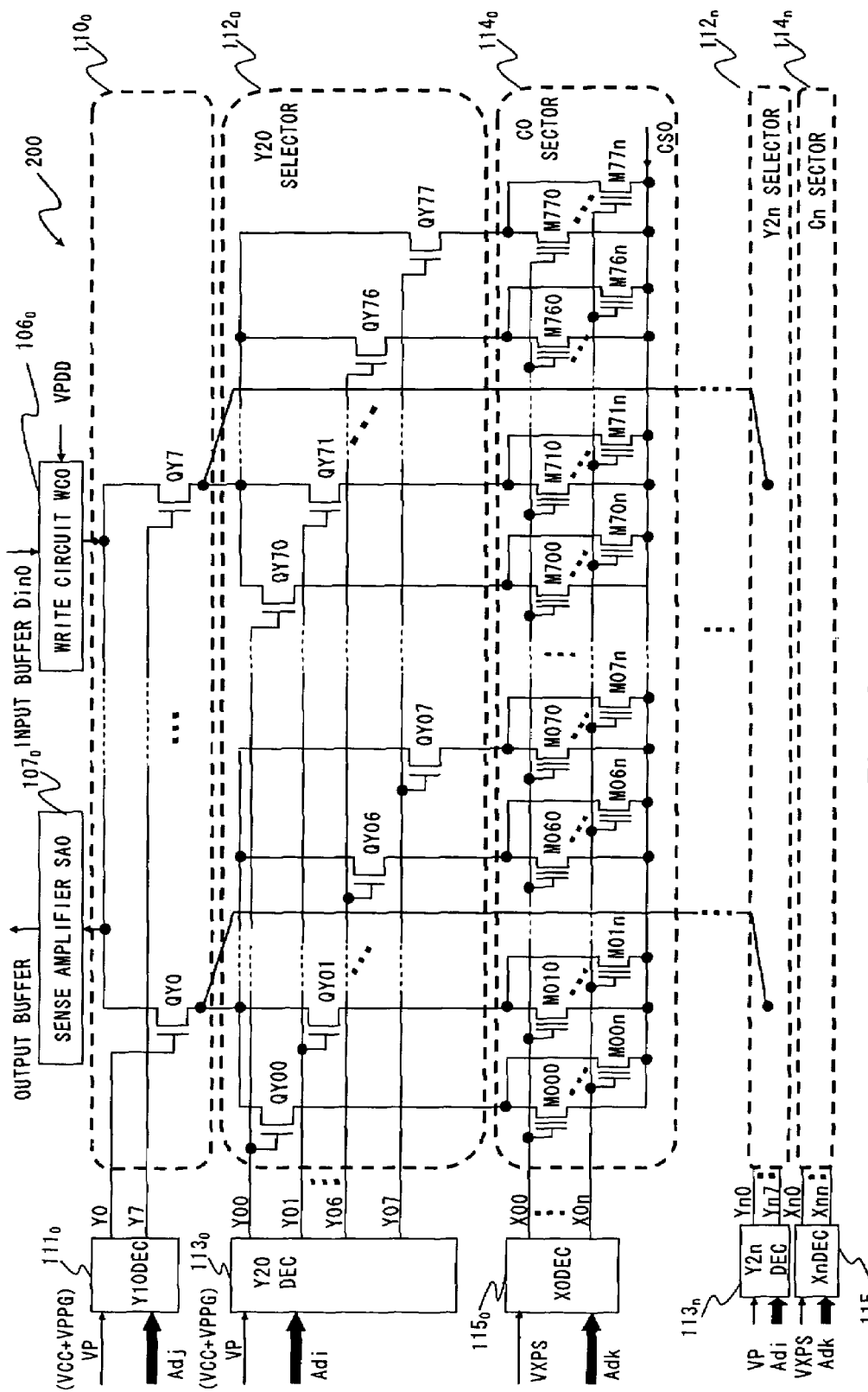
FIG. 2 is a circuit diagram of a memory functional circuit according to the first embodiment.

A memory functional circuit include one write circuit WC0, one sense amplifier SA0, Y10 selector $110_0$, Y10DEC $111_0$ and a plurality of cells 105 connected to the Y10 selector $110_0$. FIG. 2 shows a memory functional circuit 200.

The memory functional circuit 200 includes Y10 selector $110_0$ connected to the write circuit WC0 and the sense amplifier SA0, Y10DEC $111_0$ controlling the Y10 selector $110_0$, Y20 selector $112_0$ to Y2n selector $112_n$ (which are referred to collectively as Y2 selector 112) connected to the Y10 selector $110_0$, Y20DEC $113_0$ to Y2nDEC $113_n$ (which are referred to collectively as Y2DEC 113) respectively controlling a corresponding Y2 selector 112, C0 sector $114_0$ to Cn sector $114_n$ (which are referred to collectively as C sector 114) respectively connected to each Y2 selector, and X0DEC $115_0$ to XnDEC $115_n$ (which are referred to collectively as XDEC 115) controlling a corresponding sector.

The write circuit WC0 supplies a write control voltage VPDD and a write control current IL for writing data into memory devices (e.g. M000 to M07n, M700 to M77n and so on) in a sector according to a data signal Din0 from an input buffer (not shown). The write circuit WC0 is detailed later. The sense amplifier SA0 reads the data stored in a memory device and transmits it to an output buffer (not shown) connected in a subsequent stage.

The Y10 selector $110_0$ has a plurality of high order select transistors (e.g. QY0 to QY7). The drains of the plurality of high order select transistors are respectively connected to the write circuit WC0. The gates of the plurality of high order select transistors are respectively supplied with a high order select control signal output from a corresponding Y10DEC $111_0$. The high order select control signal activates one of the plurality of high order select transistors. The high order select control signal is generated by Y10DEC $111_0$ according to an address signal Adj and a control voltage VP (including a boosted voltage VPPG and a power supply voltage VCC) input to the Y10DEC $111_0$.

The memory functional circuit 200 includes n number of low order selectors Y20 selector $112_0$ to Y2n selector $112_n$ which are connected to one Y10 selector $110_0$. Since the connection of each low order selector is the same, Y20 selector $112_0$ is described in detail herein.

Y20 selector $112_0$ has a plurality of low order select transistors. For example, eight low order select transistors are connected to one high order select transistor. The drains of the low order select transistors are connected to the source of the high order select transistor. The reference numeral denoting each low order select transistor is such that a second digit indicates the reference numeral of a high order select transistor and a first digit indicates the reference numeral of a low order select transistor. For example, the reference numerals of 0th to 7th low order select transistors which are connected to 0th high order select transistor QY0 are respectively QY00 to QY07.

The gates of the low order select transistors are supplied with low order select control signals output from Y20DEC $113_0$. For example, the 0th low order select transistors (QY00 to QY70) which are connected the 0th to 7th high order select transistors are supplied with the same low order select control signal through the wiring Y00 of Y20DEC $113_0$. The low order select control signal activates one of a plurality of control wirings (e.g. Y00 to Y07) connected to Y20DEC $113_0$. The low order select control signal is generated by Y20DEC $113_0$ according to an address signal Adj and a control voltage VP (including a boosted voltage VPPG and a power supply voltage VCC) input to the Y20DEC $113_0$.

The memory functional circuit 200 has a sector corresponding to each Y2 selector. For example, a C0 sector $114_0$ is connected to a Y20 selector $112_0$. Since the connection of each sector is the same, the C0 sector $114_0$ is described in detail herein.

The C0 sector $114_0$ includes a plurality of memory devise. The drain of each memory device is connected to the source of a corresponding low order select transistor. For example, n number of memory devices M000 to M00n are connected to the source of the low order select transistor QY00. The reference numeral denoting each memory device is such that third and second digits indicate the reference numeral of a corresponding low order select transistor, and a first digit indicates the reference numeral of a memory device. For example, the reference numerals of 0th to n-th memory devices which are connected to low order select transistor QY00 are respectively M000 to M00n. Further, the gate of each memory device is supplied with a memory device control signal output from X0DEC $115_0$. For example, the 0th memory devices (M000 to M070, M700 to M770 and so on) which are respectively connected to the low order select transistors of Y20 selector $112_0$ are supplied with the same memory device control signal through a memory device selection signal wiring X00 of X0DEC $115_0$. The memory device control signal activates one of a plurality of control wirings (e.g. Y00 to Y07) connected to X0DEC $115_0$. The memory device control signal is generated by X0DEC $115_0$ according to an address signal Adk and a control voltage VXPS input to the X0DEC $115_0$. The sources of the memory devices are respectively supplied with a voltage CS. The voltage CS is a predetermined voltage which is supplied in each mode of writing, erasing and reading of memory operation.

Figure 3:
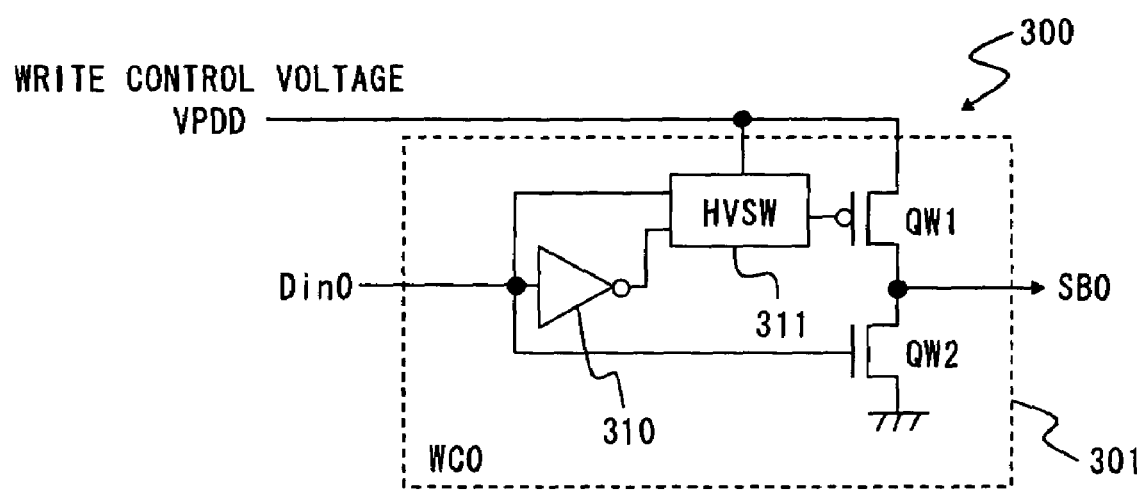
FIG. 3 is a circuit diagram of a write circuit according to the first embodiment.

The write circuit WC0 is detailed below. FIG. 3 shows internal circuits of the write circuit WC0. The write circuit 300 shown in FIG. 3 has a write signal generator 301. The write signal generator 301 receives write data Din0 and write control voltage VPDD and outputs a write signal SB0. The write signal generator 301 includes an inverter 310, a high voltage switch 311, a PMOS transistor QW1, and an NMOS transistor QW2.

The inverter 310 outputs an inversion of an input. The inverter 310 is supplied with the write data Din0, and the output of the inverter 310 is supplied to the high voltage switch 311. The high voltage switch 311 outputs High level (e.g. an input write control voltage VPDD) or Low level (e.g. a ground voltage) according to the output of the inverter 310 and the write data Din0. The output of the high voltage switch 311 is connected to the gate of the PMOS transistor QW1. The source of the PMOS transistor QW1 is supplied with the write control voltage VPDD and the drain is connected to the drain of the NMOS transistor QW2. The output signal SB0 is output from a node between the PMOS transistor QW1 and the NMOS transistor QW2. The gate of the NMOS transistor QW2 is supplied with the write data Din0 and the source is connected to the ground.

The PMOS transistor QW1 is shut off when a High level signal is supplied to its gate, and it is conductive when a Low level signal is supplied thereto. The NMOS transistor QW2 is conductive when a voltage higher than a threshold voltage is supplied to its gate and it is shut off when a Low level signal is supplied thereto. The inverter 310 and the high voltage switch 311 control the gate voltage of the transistors QW1 and QW2 so that the NMOS transistor QW2 is shut off when the PMOS transistor QW1 is conductive and the NMOS transistor QW2 is conductive when the PMOS transistor QW1 is shut off.

In sum, the write circuit WC0 outputs either a Low level signal or a write control voltage VPDD according to write data Din0. Further, the write circuit WC0 outputs a write control current IL also when it outputs a write control voltage VPDD since the output is connected to the write control voltage VPDD supplied to the write circuit WC0.

Figure 4:
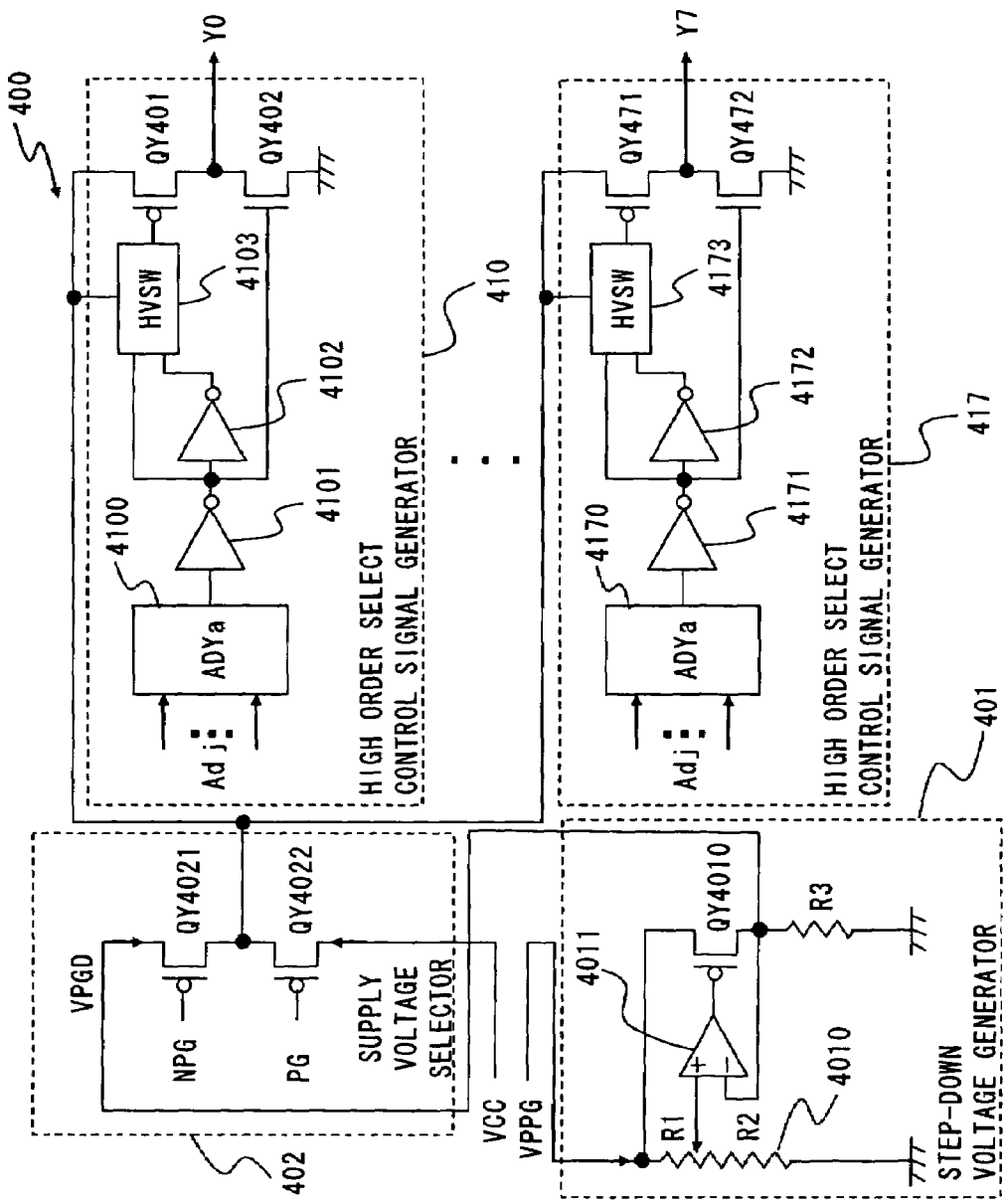
FIG. 4 is a circuit diagram of Y1DEC according to the first embodiment.

The inside of Y10DEC $111_0$ is detailed below. FIG. 4 shows a circuit diagram showing Y10DEC $111_0$. Y10DEC 400 shown in FIG. 4 includes a step-down voltage generator 401, a supply voltage selector 402 and high order select control signal generators 410 to 417. Y10DEC 400 is supplied with a boosted voltage VPPG and a power supply voltage VCC.

The step-down voltage generator 401 includes resistors 4010 and R3, an amplifier 4011 and a transistor QY4010. The resistor 4010 is connected between the boosted voltage VPPG and the ground voltage, and a positive input terminal of the amplifier 4011 is connected to divided resistors of the resistor 4010, which are R1 and R2. The output of the amplifier 4011 is connected to the gate of the transistor QY4010. The source of the transistor QY4010 is supplied with the control voltage VPPG and the resistor R3 is connected between the source of the transistor QY4010 and the ground. Anode between the transistor QY4010 and the resistor R3 is connected to the negative input terminal of the amplifier 4011 and it serves as an output of the step-down voltage generator 401.

In sum, the step-down voltage generator 401 outputs a voltage VPGD that is stepped down from a control voltage VPPG generated according to the ratio of the resistors R1 and R2 by a buffer of the amplifier 4011, the transistor QY4010 and the resistor R3.

The supply voltage selector 402 includes transistors QY4021 and QY4022. The gate of the transistor QY4022 is supplied with a selection signal PG and the gate of the transistor QY4021 is supplied with a selection signal NPG which is an inversion of the selection signal PG. The source of the transistor QY4021 is connected to the output of the step-down voltage generator 401, and the drain is connected to the drain of the transistor QY4022. The source of the transistor QY4022 is supplied with a power supply voltage VCC. A node between the transistors QY4021 and QY4022 serves as an output of the supply voltage selector 402. In sum, the supply voltage selector 402 outputs either the step-down voltage VPGD output from the step-down voltage generator 401 or the power supply voltage VCC according to the selection signals PG and NPG.

The decoder Y10DEC 400 has the same number of high order select control signal generators as the number of high order select transistors to be controlled. Since the number of the high order select transistors is eight in this embodiment, the number of the high order select control signal generators is also eight. The high order select control signal generators have the same circuit structure, and the high order select control signal generator 410 is described in detail herein.

The high order select control signal generator 410 includes an ADYa 4100, inverters 4101 and 4102, a high voltage switch 4103, a PMOS transistor QY401 and an NMOS transistor QY402.

The ADYa 4100 outputs a signal of High level or Low level according to an input address signal Adj. The signal is then input to the high voltage switch 4103 through the inverters 4101 and 4102 which are connected in series with the ADYa 4100.

The output of the inverter 4101 which is supplied with the signal from the ADYa 4100 is connected to the high voltage switch 4103 and the gate of the transistor QY402. The high voltage switch 4103 outputs either the voltage supplied from the supply voltage selector 402 or the ground voltage according to the output of the inverter 4102 and the output of the inverter 4101. The output of the high voltage switch 4103 is connected to the gate of the PMOS transistor QY401.

The source of the PMOS transistor QY401 is connected to the output of the supply voltage selector 402 and the drain is connected to the drain of the NMOS transistor QY402. The source of the NMOS transistor QY402 is connected to the ground. A node between the PMOS transistor QY401 and the NMOS transistor QY402 serves as an output of the high order select control signal generator 410, through which a high order select control signal is output.

The PMOS transistor QW401 is shut off when a High level signal is supplied to its gate, and it is conductive when a Low level signal is supplied thereto. The NMOS transistor QW402 is conductive when a voltage higher than a threshold voltage is supplied to its gate and it is shut off when a Low level signal is supplied thereto. The inverter 4102 and the high voltage switch 4103 control the gate voltage of the transistors QW401 and QW402 so that the NMOS transistor QW402 is shut off when the PMOS transistor QW401 is conductive and the NMOS transistor QW402 is conductive when the PMOS transistor QW401 is shut off. In sum, the high order select control signal generator 410 outputs either a Low level signal or a voltage output from the supply voltage selector 402 according to the address signal Adj.

Figure 5:
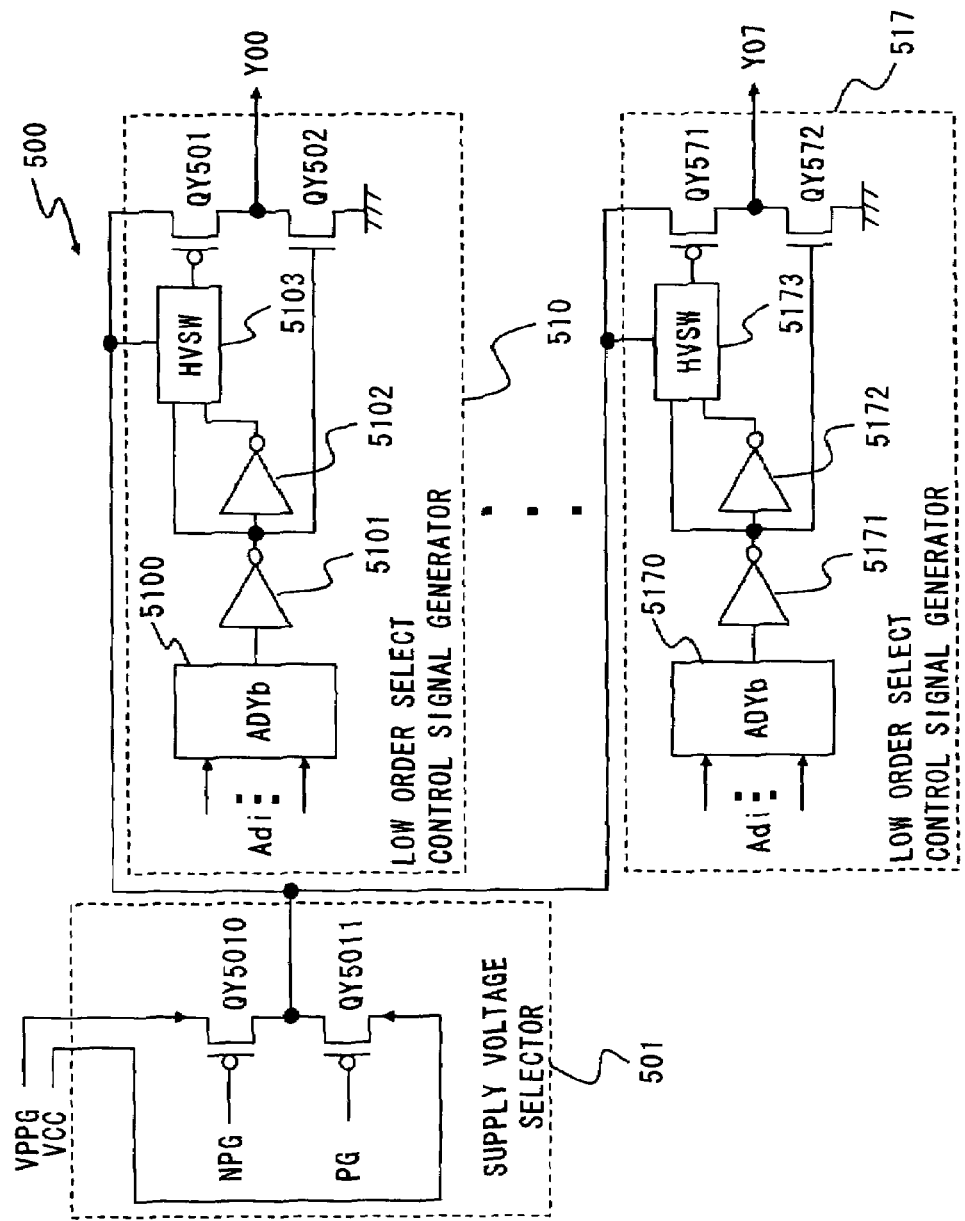
FIG. 5 is a circuit diagram of Y2DEC according to the first embodiment.

The inside of Y20DEC $113_0$ is detailed below. FIG. 5 shows a circuit diagram showing Y20DEC $113_0$. The Y20DEC 500 shown in FIG. 5 includes a supply voltage selector 501 and low order select control signal generators 510 to 517. The Y20DEC 500 is supplied with a boosted voltage VPPG and a power supply voltage VCC.

The supply voltage selector 501 includes transistors QY5010 and QY5011. The gate of the transistor QY5011 is supplied with a selection signal PG and the gate of the transistor QY5010 is supplied with a selection signal NPG which is an inversion of the selection signal PG. The source of the transistor QY5010 is supplied with a boosted voltage VPPG, and the drain is connected to the drain of the transistor QY5011. The source of the transistor QY5011 is supplied with a power supply voltage VCC. A node between the transistors QY5010 and QY5011 serves as an output of the supply voltage selector 501. In sum, the supply voltage selector 501 outputs either the boosted voltage VPPG or the power supply voltage VCC according to the selection signals PG and NPG.

The decoder Y20DEC 500 has the same number of low order select control signal generators as the number of low order select transistors groups to be controlled in block.

Since the number of the low order select transistors is eight in this embodiment, the number of the low order select control signal generators is also eight. The low order select control signal generators have the same circuit structure, and the low order select control signal generator 510 is described in detail herein.

The low order select control signal generator 510 includes an ADYb 5100, inverters 5101 and 5102, a high voltage switch 5103, a PMOS transistor QY501 and an NMOS transistor QY502.

The ADYb 5100 outputs a signal of High level or Low level according to an input address signal Adi. The signal is then input to the high voltage switch 5103 through the inverters 5101 and 5102 which are connected in series with the ADYb 5100.

The output of the inverter 5101 which is supplied with the signal from the ADYb 5100 is connected to the high voltage switch 5103 and the gate of the transistor QY502. The high voltage switch 5103 outputs either the voltage supplied from the supply voltage selector 501 or the ground voltage according to the output of the inverter 5102 and the output of the inverter 5101. The output of the high voltage switch 5103 is connected to the gate of the PMOS transistor QY501.

The source of the PMOS transistor QY501 is connected to the output of the supply voltage selector 501 and the drain is connected to the drain of the NMOS transistor QY502. The source of the NMOS transistor QY502 is connected to the ground. A node between the PMOS transistor QY501 and the NMOS transistor QY502 serves as an output of the low order select control signal generator 510, through which a low order select control signal is output.

The PMOS transistor QW501 is shut off when a High level signal is supplied to its gate, and it is conductive when a Low level signal is supplied thereto. The NMOS transistor QY502 is conductive when a voltage higher than a threshold voltage is supplied to its gate and it is shut off when a Low level signal is supplied thereto. The inverter 5102 and the high voltage switch 5103 control the gate voltage of the transistors QW501 and QY502 so that the NMOS transistor QY502 is shut off when the PMOS transistor QW501 is conductive and the NMOS transistor QY502 is conductive when the PMOS transistor QW501 is shut off. In sum, the low order select control signal generator 510 outputs either a Low level signal or a voltage output from the supply voltage selector 501 according to the address signal Adi.

The operation when the memory functional circuit 200 reads the data stored in the memory device M000 of the C0 sector 114$_0$, for example, is described herein. Firstly, according to the address signal Adk indicating the 0th address, the X0DEC 115$_0$ supplies the memory device selection signal wiring X00 with a signal for activating the 0th memory device. The memory device M000 thereby enters the data read state. Then, the low order select transistor QY00 to be connected to the memory device M000 is set to the conductive state. The low order select transistor QY00 is conducted by supplying the low order select control signal wiring Y00 with a signal for activating the 0th low order select transistor from Y20DEC 113$_0$ according to the address signal Adi indicating the 0th address. Further, the high order select transistor QY0 to be connected to the low order select transistor QY00 is set to the conductive state. The high order select transistor QY0 is conducted by supplying the high order select control signal wiring Y0 with a signal for activating the 0th high order select transistor QY0 from Y10DEC 111$_0$ according to the address signal Adj indicating the 0th address. The high order select transistor QY0 is connected to the sense amplifier SA0.

The sense amplifier SA0 to the memory device M000 are thereby conducted. Thus, the sense amplifier SA0 reads the data stored in the memory device M000 and transmits the data to the block connected in the subsequent stage.

The operation when the memory stores the data into the memory device M000 of the C0 sector 114$_0$, for example, is described herein. Firstly, according to the address signal Adk indicating the 0th address, the X0DEC 115$_0$ supplies the memory device selection signal wiring X00 with a signal for activating the 0th memory device. The memory device M000 thereby enters the data write state. Then, the low order select transistor QY00 to be connected to the memory device M000 is set to the conductive state. The low order select transistor QY00 is conducted by supplying the low order select control signal wiring Y00 with a signal for activating the 0th low order select transistor from Y20DEC 113$_0$ according to the address signal Adi indicating the 0th address. Further, the high order select transistor QY0 to be connected to the low order select transistor QY00 is set to the conductive state. The high order select transistor QY0 is conducted by supplying the high order select control signal wiring Y0 with a signal for activating the 0th high order select transistor QY0 from Y10DEC 111$_0$ according to the address signal Adj indicating the 0th address. The high order select transistor QY0 is connected to the write circuit WC0.

The write circuit WC0 to the memory device M000 are thereby conducted. Thus, the drain voltage of the memory device M000 becomes a write voltage VD and a write control current IL is supplied thereto. The memory device M000 stores the data by the write voltage VD and the write control current IL.

Figure 6:
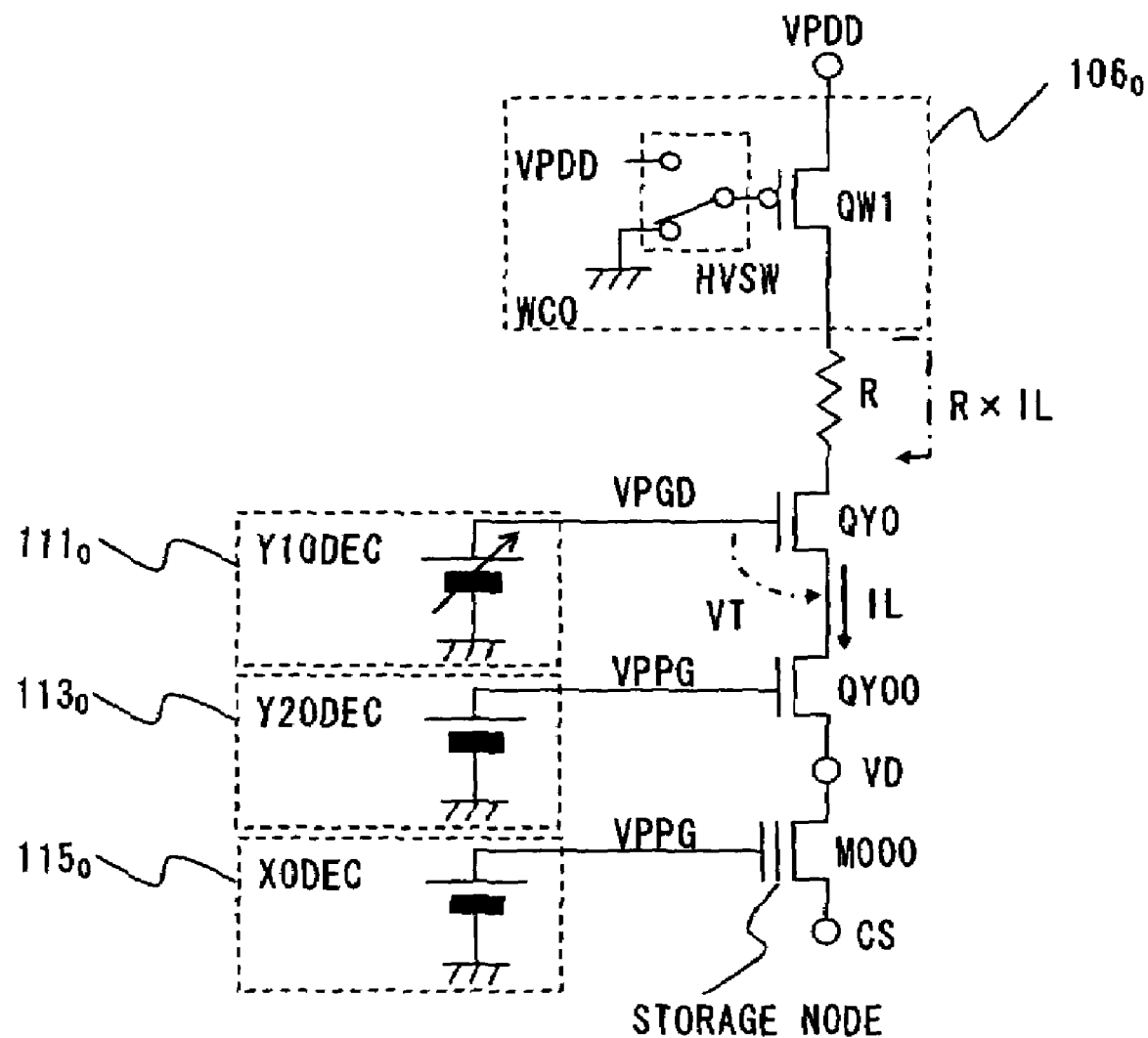
FIG. 6 is a circuit diagram of a device which becomes conductive in data writing according to the first embodiment.

FIG. 6 shows a circuit diagram of a device which becomes conductive in data writing. The write operation is described hereinafter in detail with respect to the circuit diagram of FIG. 6. Since the gate of the transistor QW1 of the write circuit WC0 is grounded, the transistor QW1 is conducted and outputs a write control voltage VPDD and a write control current IL through its drain. Though the drain of the transistor QW1 is connected to Y10 selector 1100 through wiring in the layout, a wiring resistor R is connected between the transistor QW1 and the high order select transistor QY0 in the circuit shown in FIG. 6. Since the write control current IL flows in the write operation, a voltage drop of R*IL occurs in the wiring resistor R. The voltage at the drain of the high order select transistor is thus a value of VPDD-R*IL.

The high order select control signal supplied to the gate of the high order select transistor QY0 is a step-down voltage VPGD generated from a boosted voltage VPPG in Y10DEC 111$_0$. If the current-voltage characteristics of a memory device is such that the write voltage VD is far higher than a negative resistance generation point, a large current flowing through the memory device can cause deterioration of the memory device. Further, in consideration of variations in writing, such a less controllable area in which snap-back occurs in the current-voltage characteristics of a memory device cannot be used. Thus, the step-down voltage VPGD needs to be a voltage lower than a negative resistance generation point. On the other had, if the write voltage VD is too low, writing cannot be performed. Therefore, the write voltage VD needs to be within a predetermined range that is lower than a boosted voltage VPPG and equal to and higher than a voltage to enable channel hot electron injection into a memory device. This is described in detail later with reference to FIG. 7. In this embodiment, the step-down voltage VPGD is a boosted voltage lower than a drain voltage (VPDD-R*IL) of the high order select transistor QY0. Thus, the high order select transistor QY0 has resistance r, and the write control current IL is determined depending on the resistance r. The source voltage of the high order select transistor QY0 is a value that subtracts a transistor threshold voltage VT from the step-down voltage VPGD supplied to the gate. Thus, the source voltage of the high order select transistor QY0 is a value of VPGD-VT.

The gate of the low order select transistor QY00 which is connected to the high order select transistor QY0 is supplied with the boosted voltage VPPG from Y20DEC $113_0$. The boosted voltage VPPG is such a voltage as to make the low order select transistor QY00 sufficiently conductive so that the resistance r of the transistor is sufficiently low. Accordingly, the source voltage of the source of the low order select transistor QY00 is a value of VPGD-VT, which is the same as the drain voltage. The write voltage VD of the memory device M000 is thus set by the step-down voltage VPGD supplied to the gate of the high order select transistor QY0.

The gate of the memory device M000 is supplied with the boosted voltage VPPG from X0DEC $115_0$. The memory device M000 thereby becomes conductive and accumulates electrons in a storage node (e.g. floating gate) by the write voltage VD and the write control current IL which is supplied in the writing.

Figure 7:
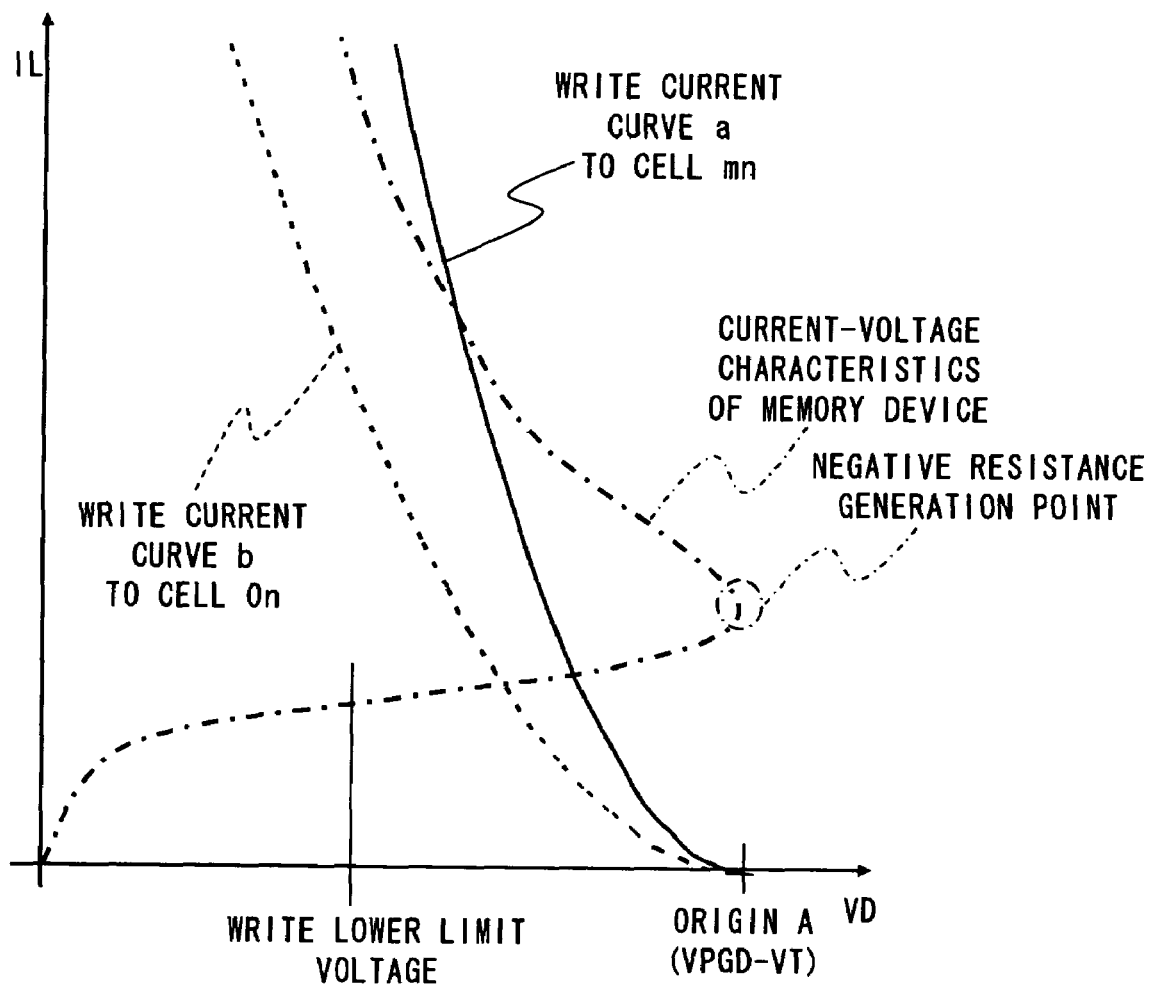
FIG. 7 is a graph showing current-voltage characteristics of a memory device and a write current curve according to the first embodiment.

FIG. 7 is the graph showing the relationship between the write control current IL and the write voltage VD. The dash-dotted line in FIG. 7 indicates the current-voltage characteristics of a memory device. The dotted line indicates a write current curve b into a cell $0n$ which is distant from the write circuit, and the full line indicates a write current curve a into a cell mn which is close to the write circuit. The slope of the graph differs by a difference in distance from the write circuit to the cell into which data is to be written because wiring resistance is larger when a cell is farther.

When storing data into a memory device, a write control current IL is supplied according to the current-voltage characteristics of the device. The memory device stores data when a write voltage VD which is at an intersection of the current-voltage characteristics of the device and the write current curve is higher than a write lower limit voltage. A write speed in the memory device is higher as the write voltage VD is higher.

The nonvolatile semiconductor memory according to this embodiment controls the write voltage VD and the write control current IL by the selectors from Y10 selector to Y1$m$ selector (which are respectively referred to as the high order selector), thereby suppressing variations in the current curve of the write control current IL due to the layout. Therefore, even in the case where variations occur in the write control voltage supplied from the write circuit to each selector due to wiring resistance from the write circuit to the high order selector, it is possible to control the write voltage VD using the step-down voltage and the threshold voltage which are not affected by the wiring resistance R by performing the control of the write control current IL and the setting of the write voltage VD in the high order selector. The write voltage VD in a chip is thereby constant regardless of the location of the write cell. Accordingly, in the nonvolatile semiconductor memory of this embodiment, variation in the write speed of the memory device is caused only by variation in the write control current IL due to a difference in wiring resistance R.

Conventional nonvolatile semiconductor memory controls a write voltage and a write control current by using a control transistor of a write circuit. Therefore, even if a write control voltage is constant in the write circuit, a write voltage VD of a memory device is a value that subtracts a value of voltage drop due to wiring resistance R from the write control voltage. Thus, variations in the wiring resistance R depending on the location of the memory device in a chip cause variations in the write voltage VD of the memory device. The slope of the write curve and the origin of the write voltage thereby changes depending on the location of the cell into which data is to be written in a chip. Hence, variations in write speed are largely affected by the location of the cell in a chip in the conventional nonvolatile semiconductor memory.

Further, the nonvolatile semiconductor memory of this embodiment is suitable for use as multilevel memory for storing a plurality of pieces of data in one memory device since write variations are small. The multilevel memory has a plurality of gate voltage settings for a memory device and stores data with each setting. It thus requires the accuracy of a write voltage and a write control current which corresponds to the gate voltage setting. Since the nonvolatile semiconductor memory of this embodiment controls the write voltage and the write control current by using a high order selector, it is capable of sufficiently accurate control which is required for multilevel memory or the like.

Furthermore, the nonvolatile semiconductor memory of the first embodiment controls the write voltage and the write control current by using a high order selector having a small number of transistors. In order to control the resistance r of a transistor by the gate voltage of the transistor, it is necessary to increase the size of the transistor to enhance the controllability. Use of a small transistor results in a small controllable range. This embodiment enables to increase the size of a high order select transistor even with the use of a micro memory device and thereby achieve highly integrated memory with high accuracy.

In addition, since the nonvolatile semiconductor memory of the first embodiment allows designing a large size of a high order select transistor, it is possible to use a large write control current. This embodiment thereby enables to achieve nonvolatile semiconductor memory with high write speed and high accuracy.

Second Embodiment

Figure 8:
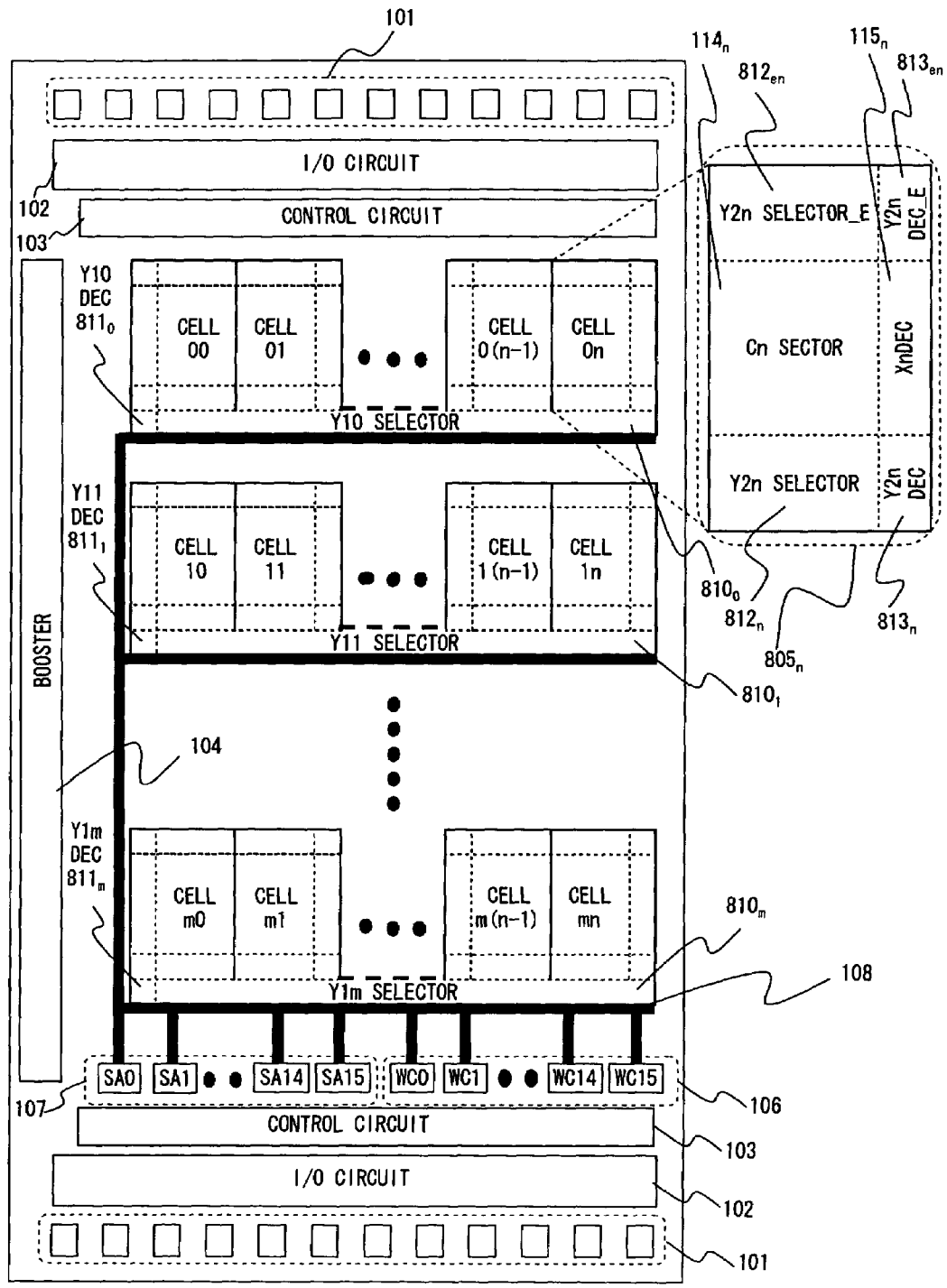
FIG. 8 is a pattern diagram of a plane layout of memory according to a second embodiment.

FIG. 8 shows a pattern diagram of a plane layout of memory according to a second embodiment of the present invention. The memory of the second embodiment operates in substantially the same manner as the memory of the first embodiment. However, they are different in that, though the memory of the first embodiment controls a write voltage and a write control current by using a voltage controlling high order selectors (e.g. Y10 selector to Y1$m$ selector), the memory of the second embodiment controls a write voltage and a write control current by using a voltage controlling even number low order selectors (e.g. Y20 selector to Y2$n$ selector) and odd number low order selectors (e.g. Y20 selector_E to Y2$n$ selector_E). Further, since it controls a write voltage and a write control current by using low order selectors, the low order selectors of the second embodiment are larger in size than the low order selectors of the first embodiment. Therefore, though each cell has one stage of low order selector in the memory of the first embodiment, each cell has low order selectors arranged in upper and lower parts of a sector in the memory of the second embodiment.

Since the operation of the memory according to the second embodiment is substantially the same as the operation of the memory according to the first embodiment, it is not described in detail herein. The following description details high order selectors, low order selectors and control of the selectors, which are different between the memory of the second embodiment and the memory of the first embodiment.

Figure 9:
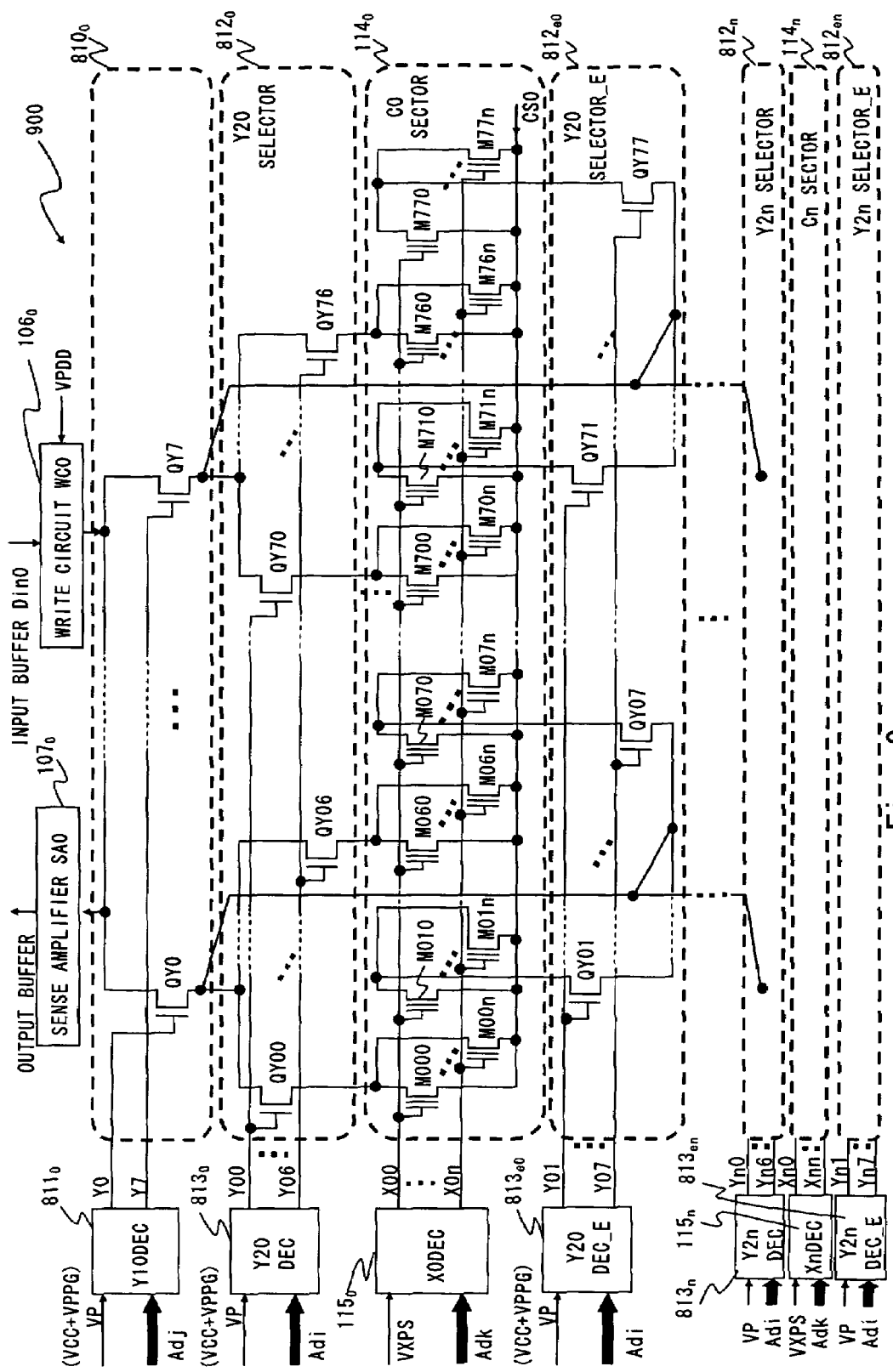
FIG. 9 is a circuit diagram of a memory functional circuit according to the second embodiment.

One write circuit WC0, one sense amplifier SA0, Y1 selector $810_0$, Y10DEC $811_0$ and a plurality of cells 805 connected to the Y10 selector $810_0$ serve as a memory functional circuit according to the second embodiment. FIG. 9 shows a circuit diagram of the memory functional circuit 900.

In the memory functional circuit 900, the write circuit WC0, the sense amplifier SA0 and memory devices (e.g. M000 to M07n, M700 to M77n and so on) in a sector are denoted in the same way as in the first embodiment, and not detailed herein.

The Y10 selector $810_0$ has a plurality of high order select transistors (e.g. QY0 to QY7). The drains of the plurality of high order select transistors are respectively connected to the write circuit. The gates of the plurality of high order select transistors are respectively supplied with a high order select control signal output from a corresponding Y10DEC $811_0$. The high order select control signal activates one of the plurality of high order select transistors. The high order select control signal is generated by Y10DEC $811_0$ according to an address signal Adj and a control voltage VP (including a boosted voltage VPPG and a power supply voltage VCC) input to the Y10DEC $811_0$.

The memory functional circuit 900 includes n number of low order even number selectors Y20 selector $812_0$ to Y2n selector $812_n$ and low order odd number selectors Y20 selector_$E812_{e0}$ to Y2n selector_$E812_{en}$ which are connected to one Y10 selector $810_0$. Since the connection of each low order selector is the same, Y20 selector $812_0$ and Y20 selector_$E812_{en}$ are described in detail herein.

The selector Y20 selector $812_0$ has a plurality of low order select transistors. For example, four of the low order select transistors are connected to one high order select transistor. The low order select transistors are low order select transistors of even numbers. Further, the selector Y20 selector_$E812_{en}$ has a plurality of low order select transistors. For example, four of the low order select transistors are connected to one high order select transistor. The low order select transistors are low order select transistors of odd numbers. The plurality of low order select transistors are respectively connected to the source of a corresponding high order select transistor. The reference numeral denoting each low order select transistor is such that a second digit indicates the reference numeral of a corresponding high order select transistor and a first digit indicates the reference numeral of a low order select transistor. For example, the reference numerals of 0th to 7th low order select transistors which are connected to 0th high order select transistor QY0 are respectively QY00 to QY07. Thus, Y20 selector $812_0$ has low order select transistors QY00, QY02, QY04 and QY06, and Y20 selector_$E812_{en}$ has low order select transistors QY01, QY03, QY05 and QY07.

The gates of the low order select transistors of Y20 selector $812_0$ are supplied with low order select control signals output from Y20DEC $813_0$. For example, the 0th low order select transistors (QY00 to QY70) which are connected the 0th to 7th high order select transistors are supplied with the same low order select control signal through the wiring Y00 of Y20DEC $813_0$.

The gates of the low order select transistors of Y20 selector_$E812_{e0}$ are supplied with low order select control signals output from Y20DEC_$E813_{e0}$. For example, the 1st low order select transistors (QY01 to QY71) which are connected the 0th to 7th high order select transistors are supplied with the same low order select control signal through the wiring Y01 of Y20DEC_$E813_{e0}$.

The low order select control signal activates one of a plurality of control wirings (e.g. Y00 to Y07) connected to Y20DEC $813_0$ and Y20DEC_$E813_{e0}$. The low order select control signal is generated by Y20DEC $813_0$ and Y20DEC_$E813_{e0}$ according to an address signal Adj and a control voltage VP (including a boosted voltage VPPG and a power supply voltage VCC) input to the Y20DEC $813_0$ and Y20DEC_$E813_{e0}$.

The memory has one sector corresponding to each Y2 selector. For example, a C0 sector $114_0$ is connected to a Y20 selector $112_0$.

Figure 10:
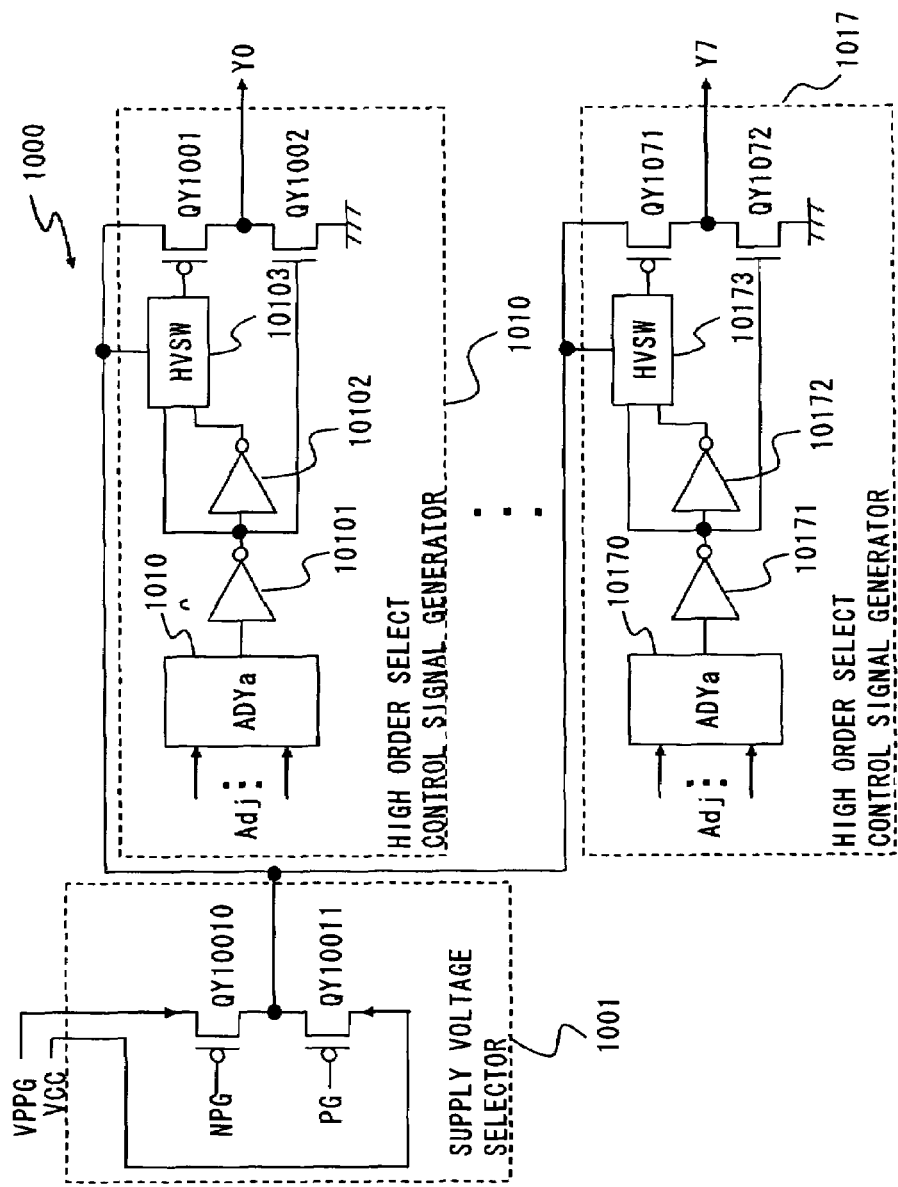
FIG. 10 is a circuit diagram of Y1DEC according to the second embodiment.

The inside of Y10DEC $811_0$ is detailed below. FIG. 10 shows a circuit diagram showing Y10DEC $811_0$. Y10DEC 1000 shown in FIG. 10 includes a supply voltage selector 1001 and high order select control signal generators 1010 to 1017. Y10DEC $811_0$ is supplied with a boosted voltage VPPG and a power supply voltage VCC.

The supply voltage selector 1001 includes transistors QY10010 and QY10011. The gate of the transistor QY10011 is supplied with a selection signal PG and the gate of the transistor QY10010 is supplied with a selection signal NPG which is an inversion of the selection signal PG. The source of the transistor QY10010 is supplied with a boosted voltage VPPG, and the drain is connected to the drain of the transistor QY10011. The source of the transistor QY10011 is supplied with a power supply voltage VCC. A node between the transistors QY10010 and QY10011 serves as an output of the supply voltage selector 1001. In sum, the supply voltage selector 1001 outputs either the boosted voltage VPPG or the power supply voltage VCC according to the selection signals PG and NPG.

The decoder Y10DEC 1000 has the same number of high order select control signal generators as the number of high order select transistors. Since the number of the high order select transistors is eight in this embodiment, the number of the high order select control signal generators is also eight. The high order select control signal generators have the same circuit structure, and the high order select control signal generator 1010 is described in detail herein.

The high order select control signal generator 1010 includes an ADYa 10100, inverters 10101 and 10102, a high voltage switch 10103, a PMOS transistor QY1001 and an NMOS transistor QY1002.

The ADYa 10100 outputs a signal of High level or Low level according to an input address signal Adj. The signal is then input to the high voltage switch 10103 through the inverters 10101 and 10102 which are connected in series with the ADYa 10100.

The output of the inverter 10101 which is supplied with the signal from the ADYa 10100 is connected to the high voltage switch 10103 and the gate of the transistor QY1002. The high voltage switch 10103 outputs either the voltage supplied from the supply voltage selector 1001 or the ground voltage according to the output of the inverter 10102 and the output of the inverter 10101. The output of the high voltage switch 10103 is connected to the gate of the PMOS transistor QY1001.

The source of the PMOS transistor QY1001 is connected to the output of the supply voltage selector 1002 and the drain is connected to the drain of the NMOS transistor QY1002. The source of the NMOS transistor QY1002 is connected to the ground. A node between the PMOS transistor QY1001 and the NMOS transistor QY1002 serves as an output of the high order select control signal generator 1010, through which a high order select control signal is output.

The PMOS transistor QY1001 is shut off when a High level signal is supplied to its gate, and it is conductive when a Low level signal is supplied thereto. The NMOS transistor QY1002 is conductive when a voltage higher than a threshold voltage is supplied to its gate and it is shut off when a Low level signal is supplied thereto. The inverter 10102 and the high voltage switch 10103 control the gate voltage of the transistors QY1001 and QY1002 so that the NMOS transistor QY1002 is shut off when the PMOS transistor QY1001 is conductive and the NMOS transistor QY1002 is conductive when the PMOS transistor QY1001 is shut off. In sum, the high order select control signal generator 1010 outputs either a Low level signal or a voltage output from the supply voltage selector 1001 according to the address signal Adj.

Since Y20DEC 813$_0$ and Y20DEC_E813$_{e0}$ have the same internal circuit and are different only in the low order selectors connected to the output, the following description details Y20DEC 813$_0$ only.

Figure 11:
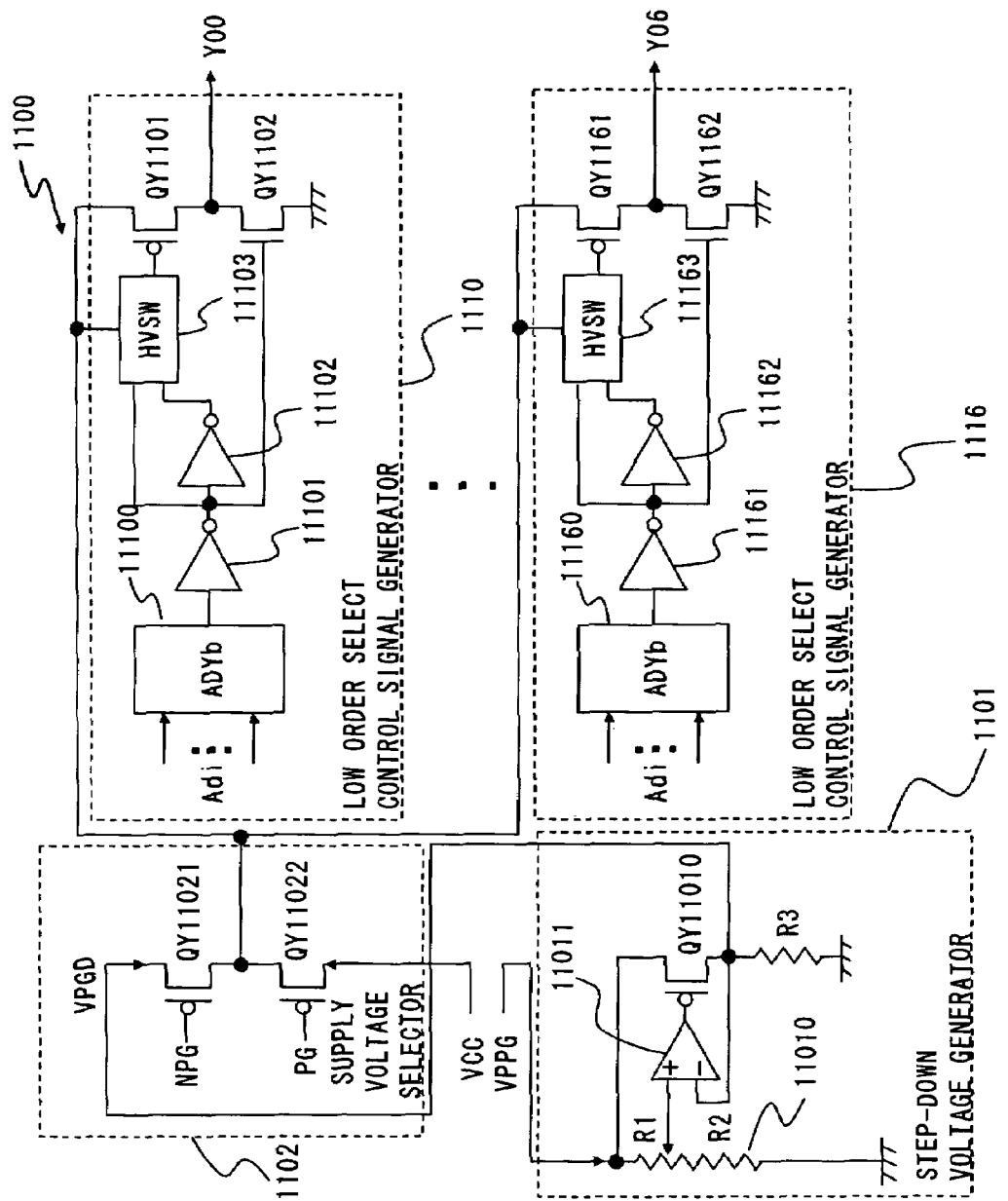
FIG. 11 is a circuit diagram of Y2DEC according to the second embodiment.

The inside of Y20DEC 813$_0$ is detailed below. FIG. 11 shows a circuit diagram showing Y20DEC 813$_0$. The Y20DEC 1100 shown in FIG. 11 includes a step-down voltage generator 1101, a supply voltage selector 1102 and low order select control signal generators 1110 to 1116. Y20DEC 813$_0$ is supplied with a boosted voltage VPPG and a power supply voltage VCC.

The step-down voltage generator 1101 includes resistors 11010 and R3, an amplifier 11011 and a transistor QY11010. The resistor 11010 is connected between the boosted voltage VPPG and the ground voltage, and a positive input terminal of the amplifier 11011 is connected to divided resistors of the resistor 11010, which are R1 and R2. The output of the amplifier 11011 is connected to the gate of the transistor QY1110. The source of the transistor QY11010 is supplied with the control voltage VPPG and the resistor R3 is connected between the source of the transistor QY11010 and the ground. Anode between the transistor QY11010 and the resistor R3 is connected to the negative input terminal of the amplifier 11011 and it serves as an output of the step-down voltage generator 1101.

In sum, the step-down voltage generator 1101 outputs a voltage that is stepped down from a control voltage VPPG generated according to the ratio of the resistors R1 and R2 by a buffer of the amplifier 11011, the transistor QY11010 and the resistor R3.

The supply voltage selector 1102 includes transistors QY11021 and QY11022. The gate of the transistor QY11022 is supplied with a selection signal PG and the gate of the transistor QY11021 is supplied with a selection signal NPG which is an inversion of the selection signal PG. The source of the transistor QY11021 is connected to the output of the step-down voltage generator 1101, and the drain is connected to the drain of the transistor QY11022. The source of the transistor QY11022 is supplied with a power supply voltage VCC. A node between the transistors QY11021 and QY11022 serves as an output of the supply voltage selector 1102. In sum, the supply voltage selector 1102 outputs either the step-down voltage VPGD output from the step-down voltage generator 1101 or the power supply voltage VCC according to the selection signals PG and NPG.

The decoder Y20DEC 1100 has the same number of low order select control signal generators as the number of low order select transistors to be controlled in block. In this embodiment, Y20 selector 812$_0$ includes low order select transistor groups of odd numbers, and Y20 selector_E812$_{e0}$ includes low order select transistor groups of even numbers. In sum, since Y20 selector 812$_0$ controls four of eight low order select transistor groups, the number of low order select control signal generators is four. The low order select control signal generators have the same circuit structure, and the low order select control signal generator 1110 is described in detail herein.

The low order select control signal generator 1110 includes an ADYb 11100, inverters 11101 and 11102, a high voltage switch 11103, a PMOS transistor QY1101 and an NMOS transistor QY1102.

The ADYb 11100 outputs a signal of High level or Low level according to an input address signal Adi. The signal is then input to the high voltage switch 11103 through the inverters 11101 and 11102 which are connected in series with the ADYb 11100.

The output of the inverter 11101 which is supplied with the signal from the ADYb 11100 is connected to the high voltage switch 11103 and the gate of the transistor QY1102. The high voltage switch 11103 outputs either the voltage supplied from the supply voltage selector or the ground voltage according to the output of the inverter 11102 and the output of the inverter 11101. The output of the high voltage switch 11103 is connected to the gate of the PMOS transistor QY1101.

The source of the PMOS transistor QY1101 is connected to the output of the supply voltage selector 1102 and the drain is connected to the drain of the NMOS transistor QY1102. The source of the NMOS transistor QY1102 is connected to the ground. A node between the PMOS transistor QY1101 and the NMOS transistor QY1102 serves as an output of the low order select control signal generator 1110, through which a low order select control signal is output.

The PMOS transistor QY1101 is shut off when a High level signal is supplied to its gate, and it is conductive when a Low level signal is supplied thereto. The NMOS transistor QY1102 is conductive when a voltage higher than a threshold voltage is supplied to its gate and it is shut off when a Low level signal is supplied thereto. The inverter 11102 and the high voltage switch 11103 control the gate voltage of the transistors QY1101 and QY1102 so that the NMOS transistor QY1102 is shut off when the PMOS transistor QY1101 is conductive and the NMOS transistor QY1102 is conductive when the PMOS transistor QY1101 is shut off. In sum, the low order select control signal generator 1110 outputs either a Low level signal or a voltage output from the supply voltage selector 1102 according to the address signal Adi.

As described in the foregoing, though in the memory according to the first embodiment in data writing, Y10DEC 111$_0$ controlling high order selectors uses a step down voltage as an active signal. On the other hand, in the memory according to the second embodiment, Y20DEC 813$_0$ and Y20DEC_E813$_{e0}$ controlling low order selectors use a step down voltage as an active signal.

Figure 12:
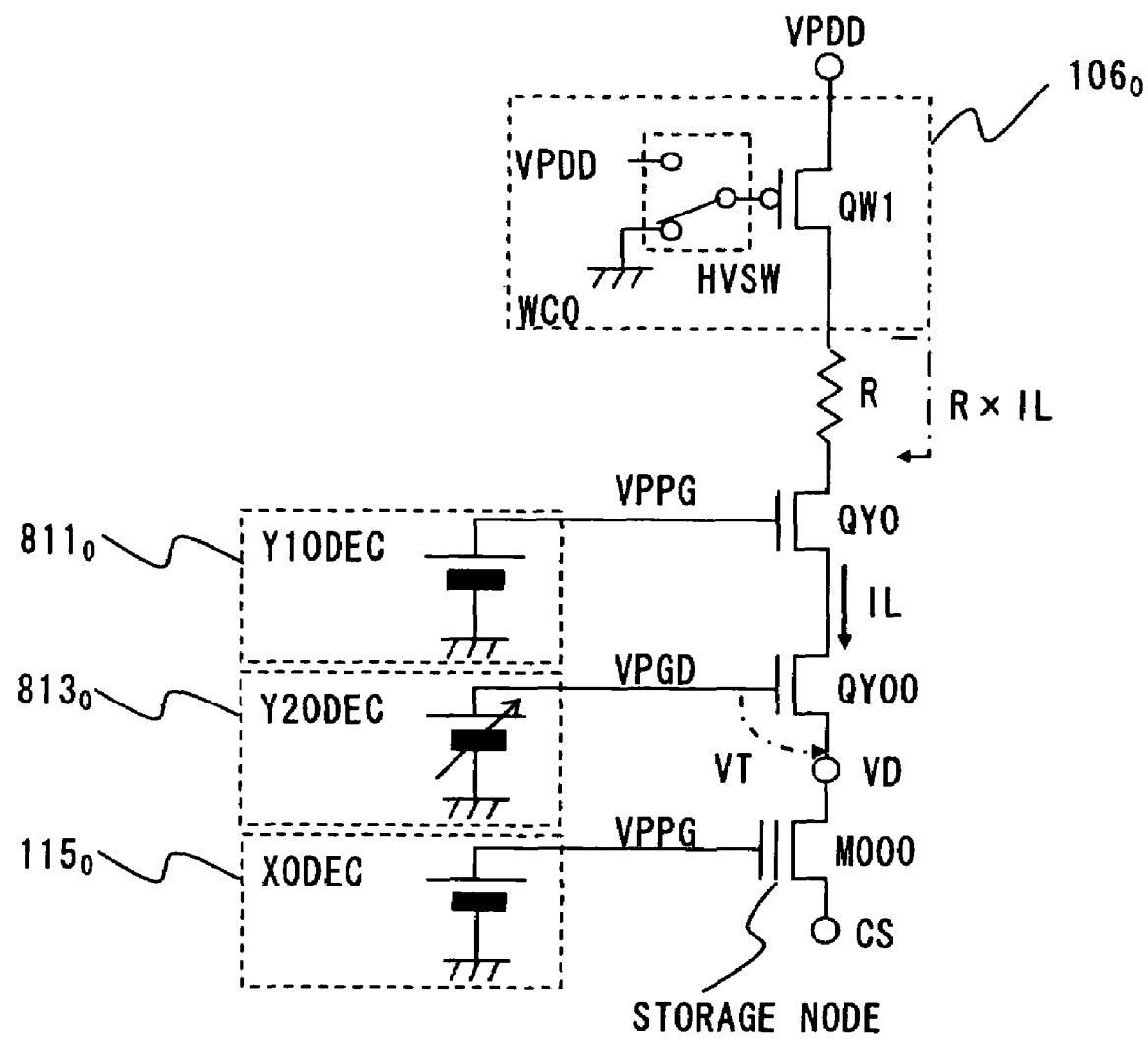
FIG. 12 is a circuit diagram of a device which becomes conductive in data writing according to the second embodiment.
Figure 13:
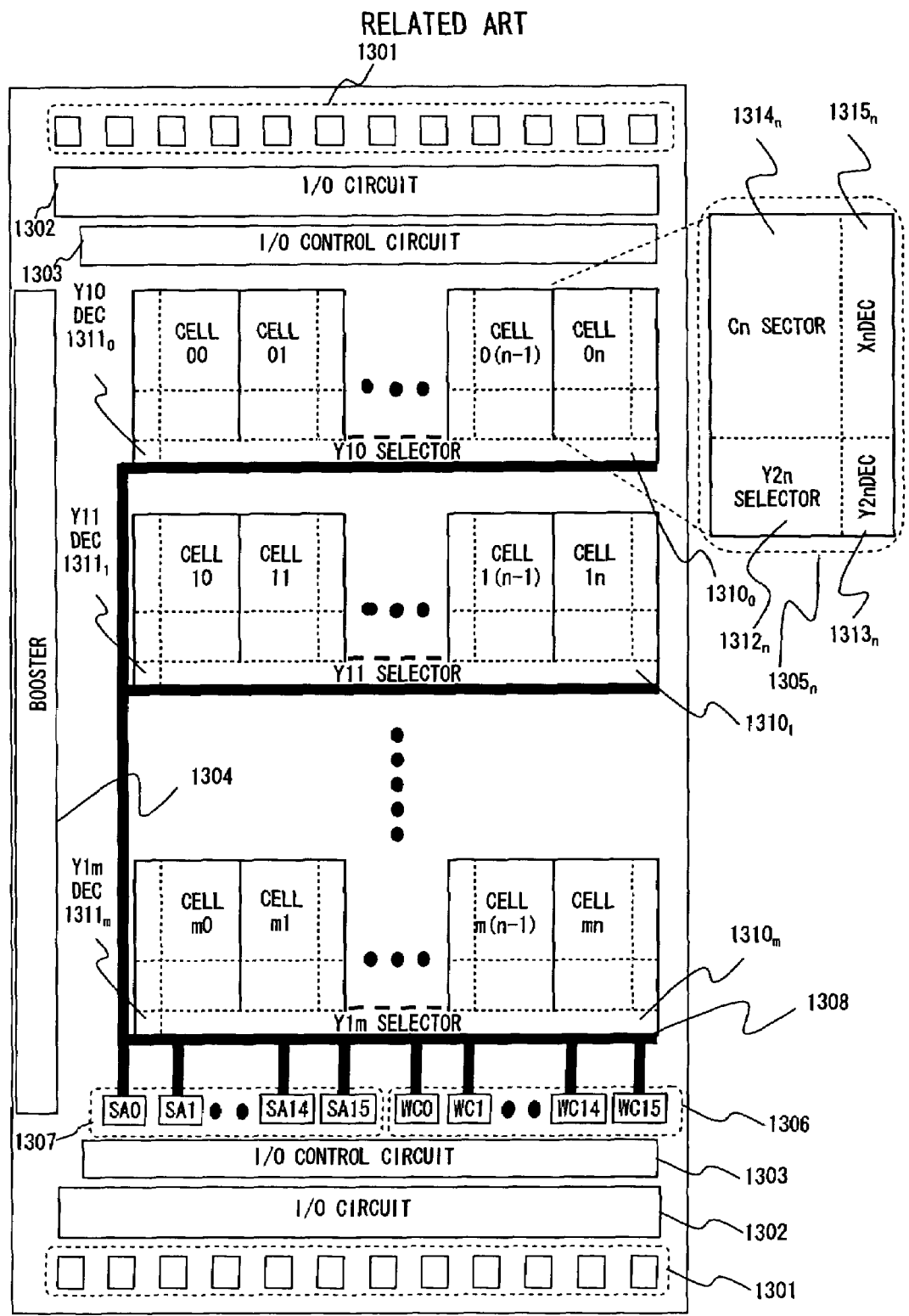
FIG. 13 is a pattern diagram of a plane layout of memory according to conventional technique.
Figure 14:
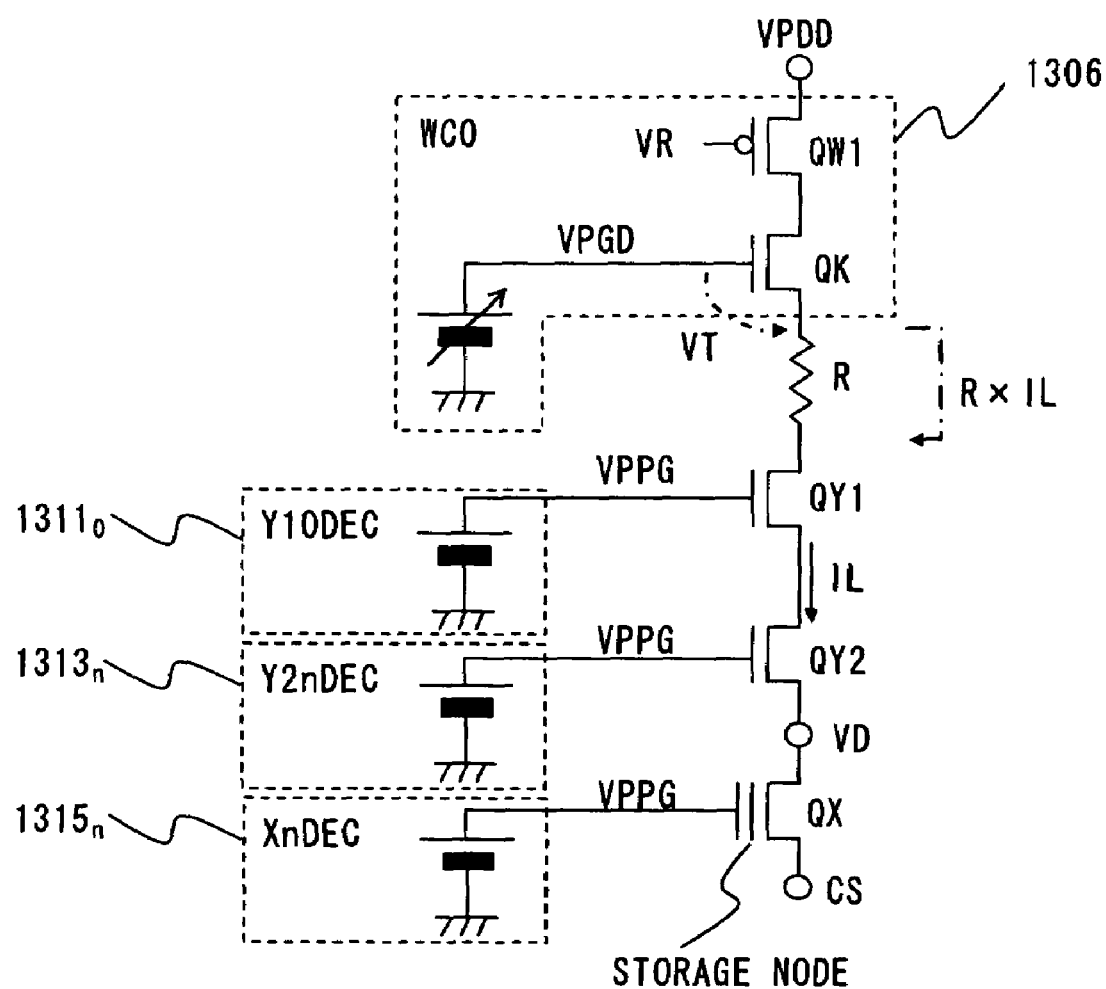
FIG. 14 is a circuit diagram of a device which becomes conductive in data writing according to conventional technique.
Figure 15:
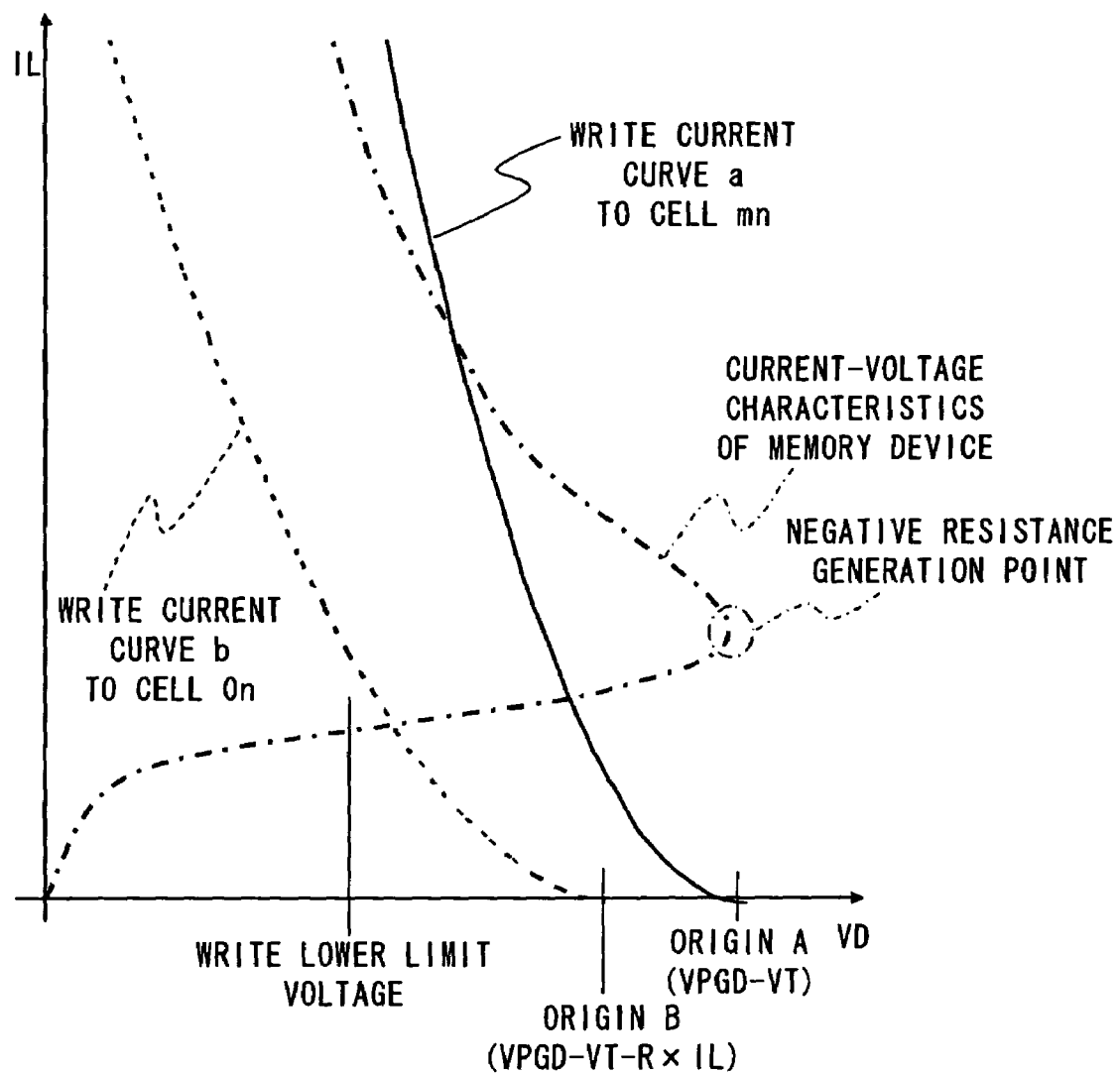
FIG. 15 is a graph showing current-voltage characteristics of a memory device and a write current curve according to conventional technique.

FIG. 12 shows a circuit diagram of a device which becomes conductive in data writing into a memory device M000 according to the second embodiment. The write operation is described hereinafter in detail with respect to the circuit diagram of FIG. 12. Since the gate of the transistor QW1 of the write circuit WC0 is grounded, the transistor QW1 is conducted and outputs a write control voltage VPDD and a write control current IL through its drain. Though the drain of the transistor QW1 is connected to Y10 selector 810$_0$ through wiring in the layout, a wiring resistor R of is connected between the transistor QW1 and the high order select transistor QY0 in the circuit shown in FIG. 12. Since the write control current IL flows in the write operation, a voltage drop of R*IL occurs in the wiring resistor R. The voltage at the drain of the high order select transistor is thus a value of VPDD-R*IL.

The high order select control signal supplied to the gate of the high order select transistor QY0 is a boosted voltage VPPG generated in Y1DEC $811_0$. The boosted voltage VPPG is such a voltage as to make the high order select transistor QY0 sufficiently conductive so that the resistance r of the transistor in the conductive state is sufficiently low. Accordingly, the source voltage of the source of the high order select transistor is a value of VPDD-R*IL.

To the gate of the low order select transistor QY00 connected to the high order select transistor QY0, a step-down voltage VPGD generated from a boosted voltage VPPG is supplied from Y20DEC 113. If the current-voltage characteristics of a memory device is such that the write voltage VD is far higher than a negative resistance generation point, a large current flowing through the memory device causes deterioration of the memory device. Further, in consideration of variations in writing, such a less controllable area in which snap-back occurs in the current-voltage characteristics of a memory device cannot be used. Thus, the step-down voltage VPGD needs to be a voltage lower than a negative resistance generation point of a memory device. On the other had, if the write voltage VD is too low, writing cannot be performed. Therefore, the write voltage VD needs to be within a predetermined range that is lower than a boosted voltage VPPG and equal to and higher than a voltage to enable channel hot electron injection into a memory device. In this embodiment, the step-down voltage VPGD is a boosted voltage which is lower than a drain voltage (VPDD-R*IL) of the low order select transistor QY00. Thus, the low order select transistor QY00 has resistance r, and the write control current IL is determined depending on the resistance r. The source voltage of the low order select transistor QY00 is a value that subtracts a transistor threshold voltage VT from the step-down voltage VPGD supplied to the gate. Thus, the source voltage of the low order select transistor QY00 is a value of VPGD-VT. The write voltage VD of the memory device M000 is thus set by the step-down voltage VPGD supplied to the gate of the low order select transistor QY00.

The gate of the memory device M000 is supplied with the boosted voltage VPPG from X0DEC $115_0$. The memory device M000 thereby becomes conductive and accumulates electrons in a storage node (e.g. floating gate) by the write voltage VD and the write control current IL.

The nonvolatile semiconductor memory according to this embodiment controls the write voltage VD and the write control current IL by the selectors from Y20 selector to Y2n selector (which are respectively referred to as the low order selector), thereby suppressing variations in the write voltage VD due to the layout. Determining the write voltage in the location close to the memory device reduces the effect of wiring from the selector to determine the write voltage to the memory device. It is thus possible to supply the memory device with a write voltage having higher accuracy than in the first embodiment.

In the memory of the second embodiment, the write voltage and the write control current can be controlled by a selector closer to the memory device compared with the first embodiment. The memory according to the second embodiment thereby allows eliminating the effects of both the wiring resistance from the write circuit to the high order selector and the wiring resistance from the high order selector to the low order selector. It is thereby possible to further suppress the variations in write speed due to the layout in a chip.

Since the memory of the second embodiment controls the write voltage and the write control current by the low order selectors, the transistor size of each low order selector is large. Accordingly, the area of the low order selector in the layout is large. However, since it is capable of controlling the write voltage and the write control current in a location closer to the memory device, the memory of this embodiment is effective for use as memory which requires high write accuracy (e.g. multilevel memory) or the like.

The present invention is not restricted to the embodiments as described above but may be varied in many ways. The present invention aims at controlling a write voltage and a write control current by a selector selecting a memory device. For example, though the above embodiments control the gate voltage in either the high order selector or the low order selector, it is feasible to control the gate voltage in both the high order selector and the low order selector. If a selector has a multilevel structure, the gate voltage in any stage of the selector may be controlled. Further, if a step-down voltage VPGD to control a selector is controlled for each selector in consideration of the location of a selector and a memory device, or if the transistor size of a selector is determined in consideration the location of a selector and a memory device, it is possible to reduce variations in the slope of the current curve due to wiring resistance. It is thereby possible to achieve the nonvolatile semiconductor memory with smaller variations and higher controllability than in the above embodiments.

Though the second embodiment controls the even number low order selectors and the odd number low order selectors by the decoders respectively corresponding thereto, it is feasible to control the low order selectors by one decoder.

It is apparent that the present invention is not limited to the above embodiment that may be modified and changed without departing from the scope and spirit of the invention.

What is claimed is:

1. Nonvolatile semiconductor memory comprising:
   a plurality of memory devices for storing data;
   a write circuit for supplying a high voltage for data writing;
   a plurality of selectors connected between the write circuit and the plurality of memory devices, for selecting one from the plurality of memory devices; and
   a control circuit for selecting one from the plurality of selectors, inputting a control voltage to a control terminal of the selected selector, and setting a write voltage for the memory device according to the control voltage.

2. The nonvolatile semiconductor memory according to claim 1, wherein a drain voltage of the memory device is set according to the control voltage input to the selector and a threshold voltage of the selector.

3. The nonvolatile semiconductor memory according to claim 1, wherein each selector includes a high order selector connected to the plurality of selectors in a subsequent stage and a low order selector connected to the plurality of memory devices in a subsequent stage.

4. The nonvolatile semiconductor memory according to claim 3, further comprising a first control circuit for controlling a gate voltage of the high order selector and controlling a flow current into the memory device.

5. The nonvolatile semiconductor memory according to claim 3, further comprising a second control circuit for controlling a gate voltage of the low order selector and controlling a flow current into the memory device.

6. The nonvolatile semiconductor memory according to claim 1, further comprising a memory device capable of storing a plurality of pieces of data in one device, in which a flow current is controlled by the control circuit.

7. The nonvolatile semiconductor memory according to claim 1,
wherein, in data writing, said control circuit supplies a voltage lower than the write voltage to a control terminal of a selector selected from the plurality of selectors, and the voltage is supplied to a drain of the memory devices through the selected selector so as to select one from the memory devices.

8. The nonvolatile semiconductor memory according to claim 1,
wherein said control circuit controls a drain voltage of the selected memory device so as to be constant regardless of a distance between the plurality of memory devices and the write circuit.

9. The nonvolatile semiconductor memory according to claim 1, wherein the write circuit receives a boost voltage and outputs the high voltage.

10. The nonvolatile semiconductor memory according to claim 1, wherein the selector includes first and second selectors connected between the write circuit and the plurality of memory devices, from which a plurality of the selectors are selected in data writing so as to select one from the plurality of memory devices.

11. The nonvolatile semiconductor memory according to claim 1, wherein the write voltage comprises a drain voltage of the selected memory device.

* * * * *